(12) United States Patent
Lai et al.

(10) Patent No.: US 12,094,400 B2
(45) Date of Patent: *Sep. 17, 2024

(54) DISPLAY PANEL AND DISPLAY DEVICE HAVING CASCADED SHIFT REGISTERS

(71) Applicant: Xiamen Tianma Micro-Electronics Co., Ltd., Xiamen (CN)

(72) Inventors: Qingjun Lai, Xiamen (CN); Yihua Zhu, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/344,886

(22) Filed: Jun. 30, 2023

(65) Prior Publication Data

US 2023/0343279 A1 Oct. 26, 2023

Related U.S. Application Data

(63) Continuation of application No. 17/528,154, filed on Nov. 16, 2021, now Pat. No. 11,721,277.

(30) Foreign Application Priority Data

May 7, 2021 (CN) .......................... 202110495311.X

(51) Int. Cl.
*G09G 3/32* (2016.01)
*G09G 3/3266* (2016.01)
(Continued)

(52) U.S. Cl.
CPC ............. *G09G 3/32* (2013.01); *G09G 3/3266* (2013.01); *G09G 3/20* (2013.01); *G09G 3/325* (2013.01); *G09G 2300/0842* (2013.01); *G09G 2300/0861* (2013.01); *G09G 2310/0286* (2013.01); *G09G 2310/061* (2013.01); *G09G 2310/08* (2013.01);
(Continued)

(58) Field of Classification Search
CPC ............ G09G 3/20; G09G 3/32; G09G 3/325; G09G 3/3266; G09G 2300/0842; G09G 2300/0861; G09G 2310/0286; G09G 2310/061; G09G 2310/08; G09G 2330/021; G09G 2340/0435; G11C 19/28
See application file for complete search history.

(56) References Cited

U.S. PATENT DOCUMENTS

| 11,721,277 B2 * | 8/2023 | Lai ........................... G09G 3/32 345/214 |
| 2023/0343279 A1 * | 10/2023 | Lai ........................... G09G 3/32 |
| 2023/0343280 A1 * | 10/2023 | Lai ........................... G09G 3/32 |

* cited by examiner

*Primary Examiner* — Adam J Snyder
(74) *Attorney, Agent, or Firm* — KILPATRICK TOWNSEND & STOCKTON LLP

(57) ABSTRACT

A display panel includes a driving circuit including N stages of cascaded shift registers, and each shift register includes: a first control part and a second control part; the second control part is configured to at least receive the signal of the second node, the signal of the third node, and a frequency control signal to generate an output signal; one shift register of the cascaded shift registers connected to a display unit in the first region is configured to receive the first frequency control signal, and one shift register of the cascaded shift registers connected to a display unit in the second region is configured to receive the second frequency control signal; a data refresh frequency of the display unit in the first region is F1, and a data refresh frequency in the second region is F2, F1<F2.

20 Claims, 13 Drawing Sheets

(51) Int. Cl.
　　　*G09G 3/20*　　　(2006.01)
　　　*G09G 3/325*　　(2016.01)
　　　*G11C 19/28*　　(2006.01)
(52) U.S. Cl.
　　　CPC ................ *G09G 2330/021* (2013.01); *G09G 2340/0435* (2013.01); *G11C 19/28* (2013.01)

DISPLAY PANEL AND DISPLAY DEVICE HAVING CASCADED SHIFT REGISTERS

CROSS-REFERENCE TO RELATED APPLICATION

This is a Continuation Application of US patent application U.S. Ser. No. 17/528,154, which claims priority to Chinese Patent Application No. 202110495311.X filed May 7, 2021, the disclosure of which is incorporated herein by reference in its entirety.

TECHNICAL FIELD

Embodiments of the present disclosure relate to the field of display technologies and, in particular, to a display panel and a display device.

BACKGROUND

With the continuous development of display technologies, more and more electronic devices with the display function are widely applied to people's daily life and work, bringing great convenience to people's daily life and work.

A display panel is a main component of an electronic device for implementing the display function. A scanning driving circuit in the display panel outputs a drive signal, and the drive signal is transmitted to a pixel circuit in a pixel array by using a signal line such as a gate line, so that the pixel array may be controlled to display an image. However, the existing scanning driving circuit cannot satisfy different voltage requirements of the pixel circuit for different signals.

SUMMARY

The present disclosure provides a display panel and a display device, to solve the problem that the shift register in the display panel cannot satisfy different voltage requirements of the pixel circuit for different signals.

In one embodiment of the present disclosure provides a display panel. The display panel includes a driving circuit including N stages of cascaded shift registers, where N≥2.

Each shift register includes a first control part and a second control part.

The first control part is configured to receive at least an input signal and control a signal of a first node and a signal of a second node in response to at least a first clock signal, and the first control part is configured to receive a first voltage signal and a second voltage signal and control a signal of a third node in response to a signal of the first node and a signal of the second node, where the first voltage signal is a high level signal, and the second voltage signal is a low level signal.

The second control part includes a first control unit, a second control unit, and a third control unit.

The first control unit is configured to receive a third voltage signal and a signal of the third node and control a signal of a fourth node in response to a frequency control signal.

The second control unit is configured to receive a fourth voltage signal and a signal of the second node and control a signal of a fifth node in response to the frequency control signal.

One of the third voltage signal or the fourth voltage signal is a high level signal, and the other one of the third voltage signal or the fourth voltage signal is a low level signal.

The third control unit is configured to receive a fifth voltage signal and generate an output signal in response to a signal of the fourth node; or the third control unit is configured to receive a sixth voltage signal and generate an output signal in response a signal of the fifth node, and the fifth voltage signal is a high level signal, and the sixth voltage signal is a low level signal.

In one embodiment of the present disclosure further provides a display device. The display device includes the display panel described in the embodiments.

In the display panel provided in embodiments of the present disclosure, a second control part includes a first control unit, a second control unit, and a third control unit, the first control unit is configured to control a signal of a fourth node in response to a frequency control signal, the second control unit is configured to control a signal of a fifth node in response to the frequency control signal, and the third control unit is configured to generate an output signal in response to a signal of the fourth node and a signal of the fifth node. In this manner, the control of the frequency control signal to the output signal can be achieved, and the output signal of a shift register can determine a refresh frequency of a pixel circuit to which the shift register is connected, which is conducive to respectively controlling output signals of different shift registers by controlling frequency control signals, to achieve that image refresh frequencies of different regions of the display panel are different.

DETAILED DESCRIPTION

Figure 1:
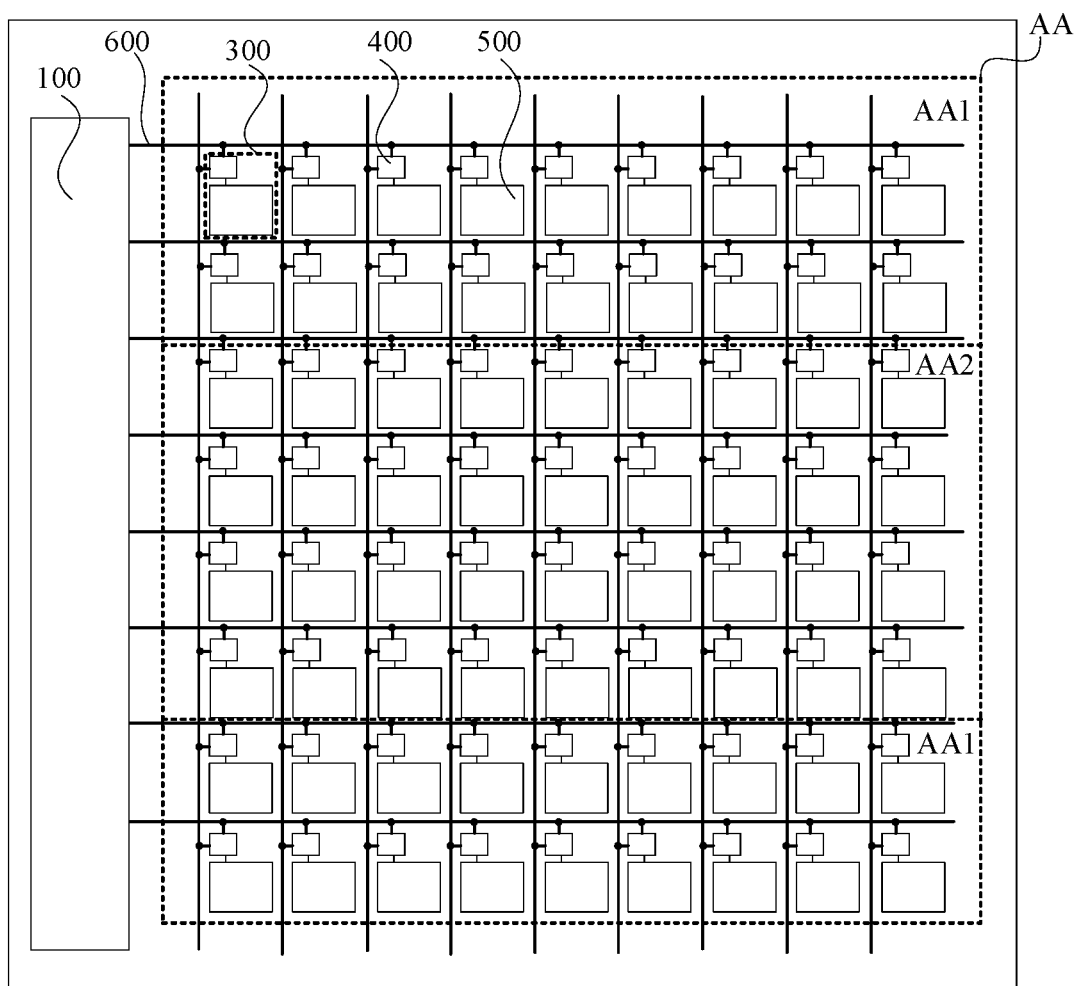
FIG. 1 is a structure diagram of a display panel according to an embodiment of the present disclosure.

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only part, not all, of structures related to the present disclosure are illustrated in the drawings.

Figure 2:
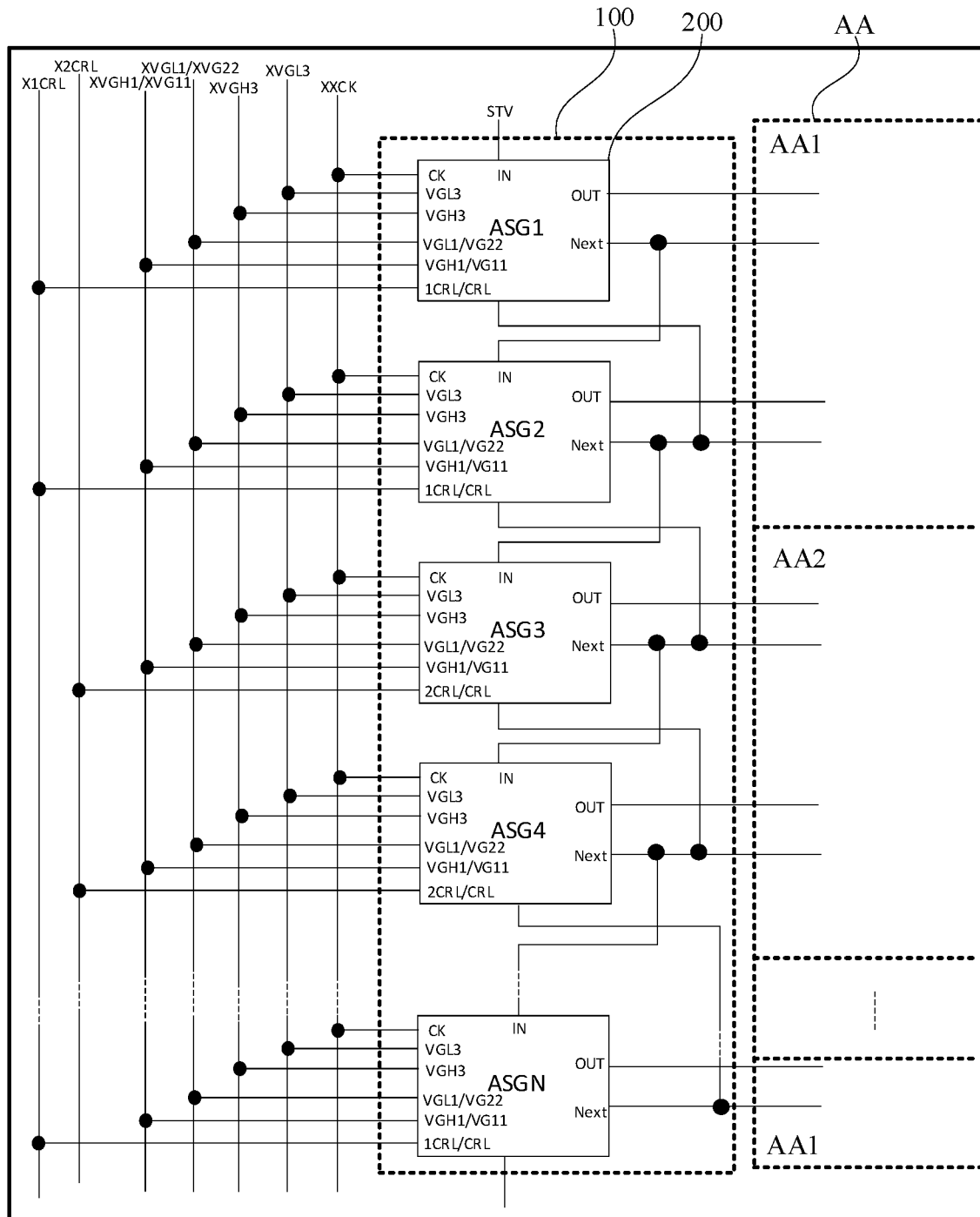
FIG. 2 is a structure diagram of a driving circuit according to an embodiment of the present disclosure.
Figure 3:
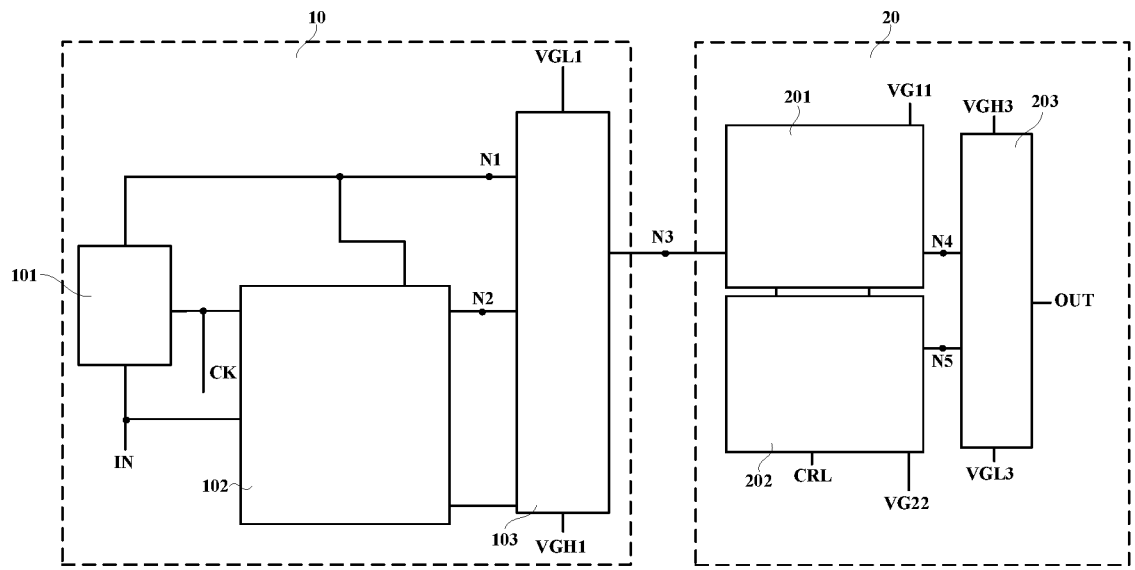
FIG. 3 is a structure diagram of a shift register according to an embodiment of the present disclosure.
Figure 4:
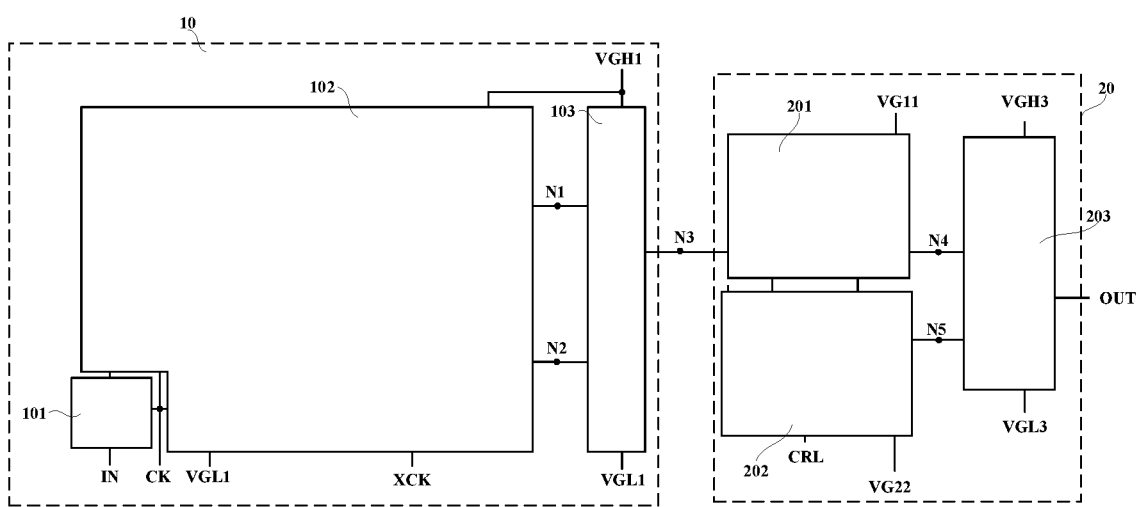
FIG. 4 is a structure diagram of another shift register according to an embodiment of the present disclosure.

FIG. 1 is a structure diagram of a display panel according to an embodiment of the present disclosure, FIG. 2 is a structure diagram of a driving circuit according to an embodiment of the present disclosure, FIG. 3 is a structure diagram of a shift register according to an embodiment of the present disclosure, and FIG. 4 is a structure diagram of another shift register according to an embodiment of the present disclosure. As shown in FIGS. 1 to 4, the display panel provided in the embodiment of the present disclosure includes a driving circuit 100. The driving circuit 100 includes N stages of cascaded shift registers 200, where N≥2. The shift register 200 includes a first control part 10 and a second control part 20. The first control part 10 receives at least an input signal IN and controls a signal of a first node N1 and a signal of a second node N2 in response to at least a first clock signal CK, and the first control part 10 receives a first voltage signal VGH1 and a second voltage signal VGL1 and controls a signal of a third node N3 in response to a signal of the first node N1 and a signal of the second node N2, where the first voltage signal VGH1 is a high level signal, and the second voltage signal VGL1 is a low level signal. The second control part 20 includes a first control unit 201, a second control unit 202, and a third control unit 203. The first control unit 201 is configured to receive a third voltage signal VG11 and a signal of the third node N3 and control a signal of a fourth node N4 in response to a frequency control signal CRL. The second control unit 202 is configured to receive a fourth voltage signal VG22 and a signal of the second node N2 and control a signal of a fifth node N5 in response to the frequency control signal CRL. One of the third voltage signal VG11 or the fourth voltage signal VG22 is a high level signal, and the other one of the third voltage signal VG11 or the fourth voltage signal VG22 is a low level signal. The third control unit 203 is configured to receive a fifth voltage signal VGH3 and generate an output signal in response to a signal of the fourth node N4; or the third control unit 203 is configured to receive a sixth voltage signal VGL3 and generate an output signal in response a signal of the fifth node N5, where the fifth voltage signal VGH3 is a high level signal, and the sixth voltage signal VGL3 is a low level signal.

For example, as shown in FIG. 1, a display region AA of the display panel is provided with multiple display units 300 arranged in an array, and each display unit 300 has one pixel circuit 400 and one light-emitting element 500. The driving circuit 100 is connected to the pixel circuit 400 through a first drive signal line 600 and provides a drive signal for the pixel circuit 400, so that the pixel circuit 400 drives the light-emitting element 500 to emit light and then an image is displayed.

It is to be noted that in FIG. 1, only one structure of the display panel is used as an example for description. FIG. 1 illustrates that the driving circuit 100 is located on one side of the display panel by way of example. In other embodiments of the present disclosure, driving circuits 100 may also be located on two sides of the display panel, which will not be repeated herein.

In the embodiment of the present disclosure, as shown in FIG. 2, the driving circuit 100 includes N stages of cascaded shift registers 200, where N≥2, and a shift register 200 at each stage provides a drive signal for the pixel circuit 400 connected to the shift register 200, so that the pixel circuit 400 connected to the shift register 200 drives the light-emitting element 500 to emit light and then an image is displayed. Therefore, different shift registers 200 may provide drive signals for the pixel circuits 400 in different regions of the display panel, so that the image refresh frequencies of different regions may be controlled by controlling the output signals of shift registers in different regions.

With reference to FIGS. 2 and 3, the shift register 200 in the driving circuit 100 includes the first control part 10 and the second control part 20. The first control part 10 controls the signal of the second node N2 and the signal of the third node N3 based on the input signal IN, the first clock signal CK, the first voltage signal VGH1, and the second voltage signal VGL1. The first control unit 201 and the second control unit 202 of the second control part 20 controls the signal of the fourth node N4 and the signal of the fifth node N5 based on the third voltage signal VG11, the fourth voltage signal VG22, and the signal of the second node N2 and the signal of the third node N3 controlled by the first control part 10 and in response to the frequency control signal CRL. The third control unit 203 of the second control part 20 generates an output signal OUT based on the fifth voltage signal VGH3 and the sixth voltage signal VGL3 and in response to the signal of the fourth node N4 and the signal of the fifth node N5. That is, the first control part 10 and the first control unit 201 and the second control unit 202 of the second control part 20 are the control part of the shift register 200 and play a control role; and the third control unit 203 of the second control part 20 is the output part of the shift register 200 and is configured to generate the output signal OUT.

The first control unit 201 of the second control part 20 controls the signal of the fourth node N4 in response to the frequency control signal CRL, the second control unit 202 controls the signal of the fifth node N5 in response to the frequency control signal CRL, and the third control unit 203 generates the output signal OUT in response to the signal of the fourth node N4 and the signal of the fifth node N5. In this manner, the control of the frequency control signal CRL to the output signal OUT can be achieved, and the output signal OUT of the shift register 200 can determine a refresh frequency of the pixel circuit 400 to which the shift register 200 is connected, which is conducive to respectively controlling output signals OUT of different shift registers 200 by controlling the frequency control signals CRL, to achieve that image refresh frequencies of different regions of the display panel are different.

In the display panel provided in the embodiment of the present disclosure, the second control part 20 includes the first control unit 201, the second control unit 202, and the third control unit 203, the first control unit 201 controls the signal of the fourth node N4 in response to the frequency control signal CRL, the second control unit 202 controls the signal of the fifth node N5 in response to the frequency control signal CRL, and the third control unit 203 generates the output signal OUT in response to the signal of the fourth node N4 and the signal of the fifth node N5. In this manner, the control of the frequency control signal CRL to the output signal OUT can be achieved, which is conducive to respectively controlling output signals OUT of different regions of the display panel by controlling the frequency control signals CRL, to achieve that image refresh frequencies of different regions of the display panel are different.

With continued reference to FIGS. 1 to 4, in an embodiment, the potential of the first voltage signal VGH1 is equal to or higher than the potential of the fifth voltage signal VGH3, and/or the potential of the second voltage signal VGL1 is equal to or lower than the potential of the sixth voltage signal VGL3.

The normal operation of the first control part 10 is ensured by providing the first voltage signal VGH1 and the second voltage signal VGL1 for the first control part 10; and the voltage signals (the fifth voltage signal VGH3 and the sixth voltage signal VGL3) received by the third control unit 203 of the second control part 20 are separated from the voltage signals (the first voltage signal VGH1 and the second voltage signal VGL1) received by the first control part 10 and the first control unit 201 of the second control part 20, that is, the voltage signals of the control part of the shift register 200 are separated from the voltage signals of the output part of the shift register 200. In this manner, the voltage of the output signal OUT can be changed by changing the fifth voltage signal VGH3 and the sixth voltage signal VGL3, so that the required signals are selectively output according to different requirements of the pixel circuit 400 in the display panel for different signals, and thus the flexibility of the driving circuit 100 outputting signal voltages can be improved.

At the same time, the potential of the first voltage signal VGH1 is equal to or higher than the potential of the fifth voltage signal VGH3, and the second voltage signal VGL1 is equal to or lower than the sixth voltage signal VGL3. In this manner, the potential of the high potential signal among the signals of the nodes of the control part is higher than the potential of the fifth voltage signal VGH3, or the potential of the low potential signal of the nodes of the control part is lower than the potential of the sixth voltage signal VGL3, so that the transistor of the output part tends to operate in a saturated state in an on state and can be fully turned off in an off state, and thus the output signal OUT is more stable.

With continued reference to FIGS. 1 to 4, in an embodiment, the potential of one of the third voltage signal VG11 and the fourth voltage signal VG22 which is a high level signal is equal to the potential of the first voltage signal VGH1 or equal to the potential of the fifth voltage signal VGH3; and the potential of one of the third voltage signal VG11 or the fourth voltage signal VG22 which is a low level signal is equal to the potential of the second voltage signal VGL1 or equal to the potential of the sixth voltage signal VGL3.

One of the third voltage signal VG11 or the fourth voltage signal VG22 is a high level signal, and the other one of the third voltage signal VG11 or the fourth voltage signal VG22 is a low level signal. The potential of one of the third voltage signal VG11 or the fourth voltage signal VG22 which is a high level signal is equal to the potential of the first voltage signal VGH1 or equal to the potential of the fifth voltage signal VGH3, that is, the first voltage signal VGH1 is multiplexed into one of the third voltage signal VG11 or the fourth voltage signal VG22 which is a high level signal, or the fifth voltage signal VGH3 is multiplexed into one of the third voltage signal VG11 or the fourth voltage signal VG22 which is a high level signal. In this manner, the arrangement of signals and wiring can be reduced, which is conducive to simplifying the circuit structure of the shift register 200 and reducing the complexity of the shift register 200.

Similarly, the potential of one of the third voltage signal VG11 or the fourth voltage signal VG22 which is a low level signal is equal to the potential of the second voltage signal VGL1 or equal to the potential of the sixth voltage signal VGL3, that is, the second voltage signal VGL1 is multiplexed into one of the third voltage signal VG11 or the fourth voltage signal VG22 which is a low level signal, or the sixth voltage signal VGL3 is multiplexed into one of the third voltage signal VG11 or the fourth voltage signal VG22 which is a low level signal. In this manner, the arrangement of signals and wiring can be reduced, which is conducive to simplifying the circuit structure of the shift register 200 and reducing the complexity of the shift register 200.

Embodiments can combine and set the preceding schemes according to actual requirements as long as it is satisfied that one of the third voltage signal VG11 or the fourth voltage signal VG22 is a high level signal, and the other one of the third voltage signal VG11 or the fourth voltage signal VG22 is a low level signal.

For example, the potential of the third voltage signal VG11 is equal to the potential of the first voltage signal VGH1, and the potential of the fourth voltage signal VG22 is equal to the potential of the second voltage signal VGL1, so that while the complexity of the shift register 200 is reduced, when both the potential of the fourth node N4 and the potential of the fifth node N5 are high, they can be higher than the potential of the fifth voltage signal VGH3, and when the potential of the fourth node N4 and the potential of the fifth node N5 are low, they can be lower than the potential of the sixth voltage signal VGL3. In this manner, the transistor of the output part tends to operate in a saturated state in an on state and can be fully turned off in an off state, so that the output signal OUT is more stable.

Figure 5:
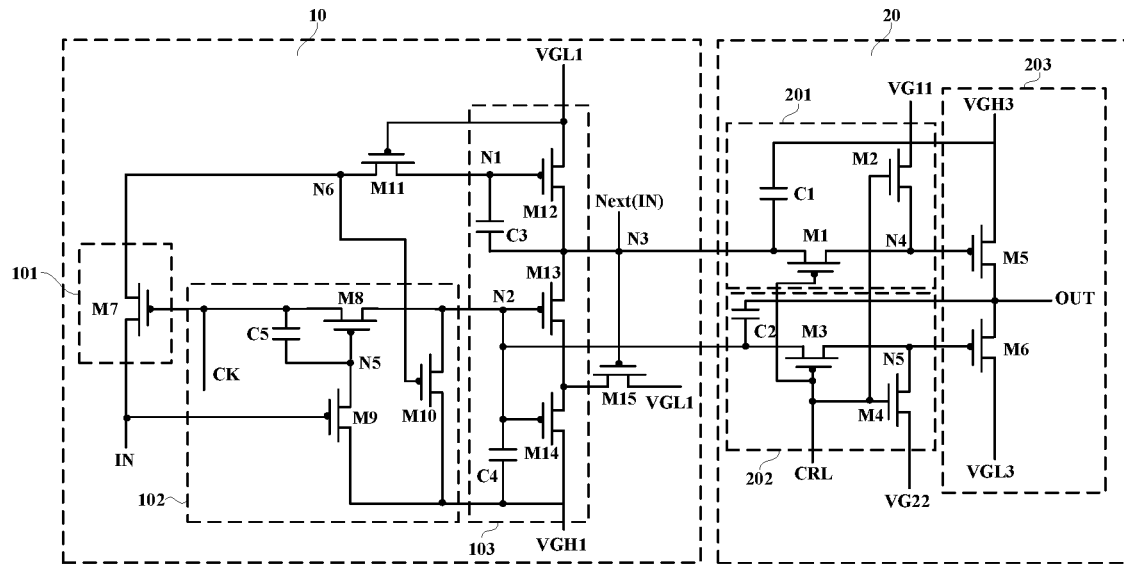
FIG. 5 is a structure diagram of another shift register according to an embodiment of the present disclosure.
Figure 6:
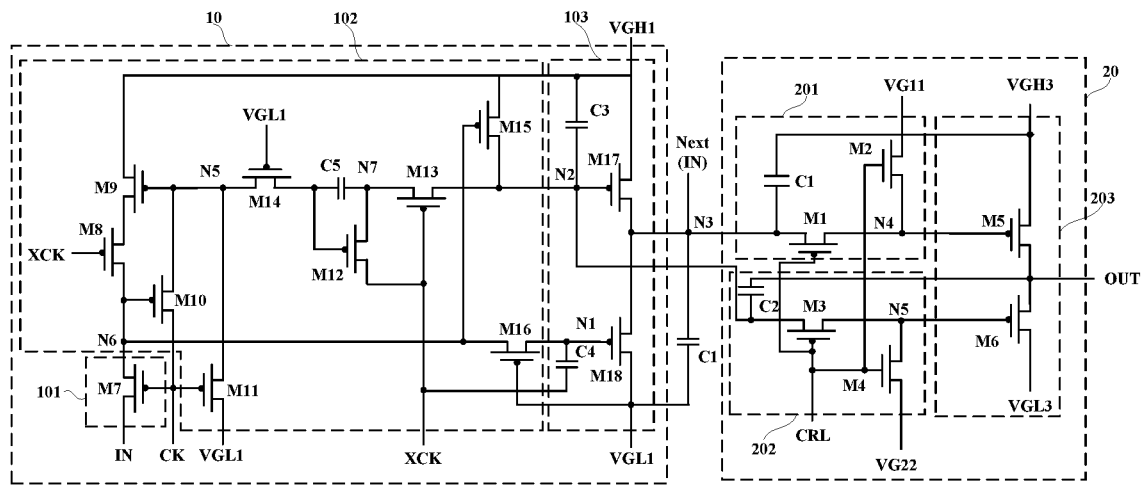
FIG. 6 is a structure diagram of another shift register according to an embodiment of the present disclosure.

FIG. 5 is a structure diagram of another shift register according to an embodiment of the present disclosure, and FIG. 6 is a structure diagram of another shift register according to an embodiment of the present disclosure. As shown in FIGS. 5 and 6, in an embodiment, the first control unit 201 includes a first transistor M1 and a second transistor M2. One terminal of the first transistor M1 is connected to the third node N3, another terminal of the first transistor M1 is connected to the fourth node N4, and a control terminal of the first transistor M1 is connected to a frequency control signal terminal and is configured to receive the frequency control signal CRL. One terminal of the second transistor M2 receives the third voltage signal VG11, another terminal of the second transistor M2 is connected to the fourth node N4, and a control terminal of the second transistor M2 is connected to the frequency control signal terminal and is configured to receive the frequency control signal CRL.

The first transistor M1 receives the signal of the third node N3, the second transistor M2 receives the third voltage signal VG11, and the first transistor M1 and the second transistor M2 jointly control the signal of the fourth node N4 in response to the frequency control signal CRL.

In an embodiment, when the first transistor M1 is turned on, the signal of the fourth node N4 is the signal of the third node N3, and when the second transistor M2 is turned on, the signal of the fourth node N4 is the third voltage signal VG11, so that the first transistor M1 and the second transistor M2 can control the signal of the fourth node N4.

With continued reference to FIGS. 5 and 6, in an embodiment, when the first transistor M1 is turned on, the second transistor M2 is turned off; or when the first transistor M1 is turned off, the second transistor M2 is turned on.

When the first transistor M1 is turned on in response to the frequency control signal CRL, the conductance between the third node N3 connected to one terminal of the first transistor M1 and the fourth node N4 connected to another terminal of the first transistor M1 is achieved. In this case, the signal of the fourth node N4 is the signal of the third node N3 controlled by the first control part 10. When the second transistor M2 is turned on in response to the frequency control signal CRL, the conductance between the third voltage signal VG11 received by one terminal of the second transistor M2 and the fourth node N4 connected to another terminal of the second transistor M2 is achieved. In this case, the signal of the fourth node N4 is the third voltage signal VG11, and the output signal OUT generated by the third control unit 203 is controlled by the signal of the fourth node N4. Therefore, the output signal OUT of the shift register 200 may be determined by the frequency control signal CRL, so that the control of the frequency control signal CRL to the output signal OUT can be achieved.

In this embodiment, only one of the first transistor M1 or the second transistor M2 is turned on, and the other one of the first transistor M1 or the second transistor M2 is turned off at the same time, so that the signal of the fourth node N4 can be switched stably in the case where the first transistor M1 and the second transistor M2 are controlled by the same frequency control signal CRL, and no additional frequency control signal is required, which is conducive to simplifying the circuit structure of the shift register 200 and reducing the complexity of the shift register 200.

With continued reference to FIGS. 5 and 6, in an embodiment, the first transistor M1 is a P-type metal oxide semiconductor (PMOS) type transistor, and the second transistor M2 is an N-type metal oxide semiconductor (NMOS) type transistor; or the first transistor M1 is an NMOS type transistor, and the second transistor M2 is a PMOS type transistor.

The first transistor M1 and the second transistor M2 are different types of transistors, so that it is achieved that the first transistor M1 and the second transistor M2 maintain different on and off states under the control of the same frequency control signal CRL.

For example, as shown in FIGS. 5 and 6, the case where the first transistor M1 is a PMOS type transistor and the second transistor M2 is an NMOS type transistor is used as an example. When the frequency control signal CRL is at a low level, the first transistor M1 is turned on, the signal of the third node N3 is transmitted to the fourth node N4, and the second transistor M2 is turned off. In this case, the signal of the fourth node N4 is the signal of the third node N3. When the frequency control signal CRL is at a high level, the first transistor M1 is turned off, the second transistor M2 is turned on, and the third voltage signal VG11 is transmitted to the fourth node N4. In this case, the signal of the fourth node N4 is the third voltage signal VG11. In this manner, it is achieved that the first transistor M1 and the second transistor M2 control the signal of the fourth node N4 under the control of the same frequency control signal CRL, and no additional frequency control signal is required, which is conducive to simplifying the circuit structure of the shift register 200 and reducing the complexity of the shift register 200.

Figure 7:
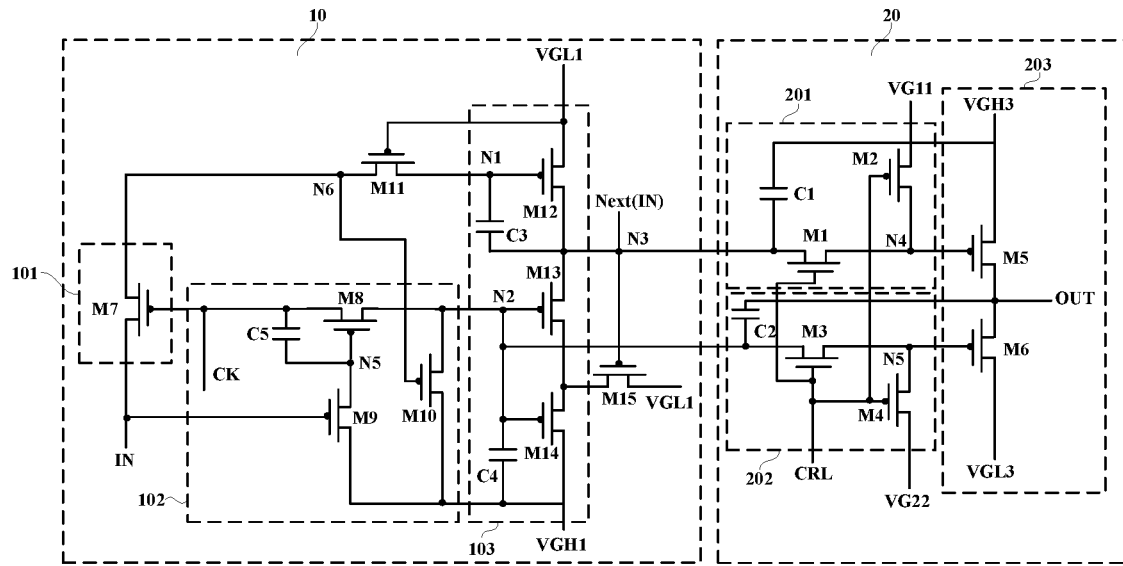
FIG. 7 is a structure diagram of another shift register according to an embodiment of the present disclosure.
Figure 8:
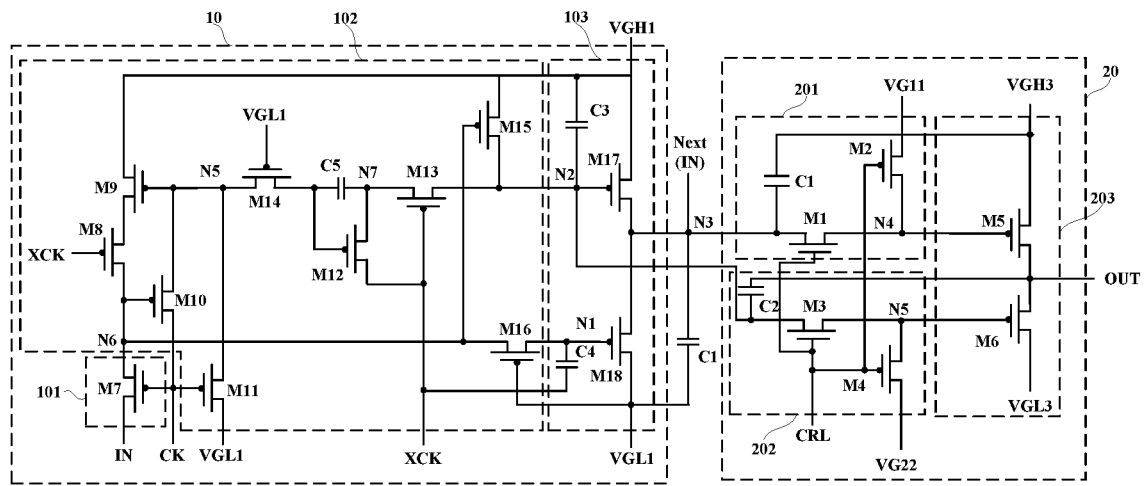
FIG. 8 is a structure diagram of another shift register according to an embodiment of the present disclosure.

Of course, the present disclosure is not limited to this. In other embodiments, as shown in FIGS. 7 and 8, FIG. 7 is a structure diagram of another shift register according to an embodiment of the present disclosure, and FIG. 8 is a structure diagram of another shift register according to an embodiment of the present disclosure, where the first transistor M1 is an NMOS type transistor, and the second transistor M2 is a PMOS type transistor. When the frequency control signal CRL is at a high level, the first transistor M1 is turned on, the signal of the third node N3 is transmitted to the fourth node N4, and the second transistor M2 is turned off. In this case, the signal of the fourth node N4 is the signal of the third node N3. When the frequency control signal CRL is at a low level, the first transistor M1 is turned off, the second transistor M2 is turned on, and the third voltage signal VG11 is transmitted to the fourth node N4. In this case, the signal of the fourth node N4 is the third voltage signal VG11. In this manner, it is achieved that the first transistor M1 and the second transistor M2 control the signal of the fourth node N4 under the control of the same frequency control signal CRL, and no additional frequency control signal is required, which is conducive to simplifying the circuit structure of the shift register 200 and reducing the complexity of the shift register 200.

With continued reference to FIGS. 5 to 8, in an embodiment, the second control unit 202 includes a third transistor M3 and a fourth transistor M4. One terminal of the third transistor M3 is connected to the second node N2, another terminal of the third transistor M3 is connected to the fifth node N5, and a control terminal of the third transistor M3 is connected to the frequency control signal terminal and is configured to receive the frequency control signal CRL. One terminal of the fourth transistor M4 receives the fourth voltage signal VG22, another terminal of the fourth transistor M4 is connected to the fifth node N5, and a control terminal of the fourth transistor M4 is connected to the frequency control signal terminal and is configured to receive the frequency control signal CRL.

The third transistor M3 receives the signal of the second node N2, the fourth transistor M4 receives the fourth voltage signal VG22, and the third transistor M3 and the fourth transistor M4 jointly control the signal of the fifth node N5 in response to the frequency control signal CRL.

In an embodiment, when the third transistor M3 is turned on, the signal of the fifth node N5 is the signal of the second node N2; and when the fourth transistor M4 is turned on, the signal of the fifth node N5 is the fourth voltage signal VG22, so that the third transistor M3 and the fourth transistor M4 can control the signal of the fifth node N5.

With continued reference to FIGS. 5 to 8, in an embodiment, when the third transistor M3 is turned on, the fourth transistor M4 is turned off; or when the third transistor M3 is turned off, the fourth transistor M4 is turned on.

When the third transistor M3 is turned on in response to the frequency control signal CRL, the conductance between the second node N2 connected to one terminal of the third transistor M3 and the fifth node N5 connected to another terminal of the third transistor M3 is achieved. In this case, the signal of the fifth node N5 is the signal of the second node N2 controlled by the first control part 10. When the fourth transistor M4 is turned on in response to the frequency control signal CRL, the conductance between the fourth voltage signal VG22 received by one terminal of the fourth transistor M4 and the fifth node N5 connected to another terminal of the fourth transistor M4 is achieved. In this case, the signal of the fifth node N5 is the fourth voltage signal VG22, and the output signal OUT generated by the third control unit 203 is controlled by the fourth voltage signal VG22. Therefore, the output signal OUT of the shift register 200 can be determined by the frequency control signal CRL, so that the control of the frequency control signal CRL to the output signal OUT can be achieved.

In this embodiment, only one of the third transistor M3 or the fourth transistor M4 is turned on, and the other one of the third transistor M3 or the fourth transistor M4 is turned off at the same time, so that the signal of the fifth node N5 can be switched stably in the case where the third transistor M3 and the fourth transistor M4 are controlled by the same frequency control signal CRL, and no additional frequency control signal is required, which is conducive to simplifying the circuit structure of the shift register 200 and reducing the complexity of the shift register 200.

With continued reference to FIGS. 5 to 8, in an embodiment, the third transistor M3 is a PMOS type transistor, and the fourth transistor M4 is an NMOS type transistor; or the third transistor M3 is an NMOS type transistor, and the fourth transistor M4 is a PMOS type transistor.

The third transistor M3 and the fourth transistor M4 are different types of transistors, so that it is achieved that the third transistor M3 and the fourth transistor M4 maintain different on and off states under the control of the same frequency control signal CRL.

For example, as shown in FIGS. 5 and 6, the case where the third transistor M3 is a PMOS type transistor and the fourth transistor M4 is an NMOS type transistor is used as an example. When the frequency control signal CRL is at a low level, the third transistor M3 is turned on, the signal of the second node N2 is transmitted to the fifth node N5, and the fourth transistor M4 is turned off. In this case, the signal of the fifth node N5 is the signal of the second node N2. When the frequency control signal CRL is at a high level, the third transistor M3 is turned off, the fourth transistor M4 is turned on, and the fourth voltage signal VG22 is transmitted to the fifth node N5. In this case, the signal of the fifth node N5 is the fourth voltage signal VG22. In this manner, it is achieved that the third transistor M3 and the fourth transistor M4 control the signal of the fifth node N5 under the control of the same frequency control signal CRL, and no additional frequency control signal is required, which is conducive to simplifying the circuit structure of the shift register 200 and reducing the complexity of the shift register 200.

Of course, the present disclosure is not limited to this. In other embodiments, as shown in FIGS. 7 and 8, the third transistor M3 is an NMOS type transistor and the fourth transistor M4 is a PMOS type transistor. When the frequency control signal CRL is at a high level, the third transistor M3 is turned on, the signal of the second node N2 is transmitted to the fifth node N5, and the fourth transistor M4 is turned off. In this case, the signal of the fifth node N5 is the signal of the second node N2. When the frequency control signal CRL is at a low level, the third transistor M3 is turned off, the fourth transistor M4 is turned on, and the fourth voltage signal VG22 is transmitted to the fifth node N5. In this case, the signal of the fifth node N5 is the fourth voltage signal VG22. In this manner, it is achieved that the third transistor M3 and the fourth transistor M4 control the signal of the fifth node N5 under the control of the same frequency control signal CRL, and no additional frequency control signal is required, which is conducive to simplifying the circuit structure of the shift register 200 and reducing the complexity of the shift register 200.

With continued reference to FIGS. 5 to 8, in an embodiment, the control terminal of the first transistor M1, the control terminal of the second transistor M2, the control terminal of the third transistor M3, and the control terminal of the fourth transistor M4 all receive the same frequency control signal CRL. Each of the first transistor M1 and the third transistor M3 is a PMOS type transistor, or each of the first transistor M1 and the third transistor M3 is an NMOS type transistor. Each of the second transistor M2 and the fourth transistor M4 is a PMOS type transistor, or each of the second transistor M2 and the fourth transistor M4 is an NMOS type transistors. In addition, the transistor types of the first transistor M1 and the second transistor M2 are different.

The types of the first transistor M1, the second transistor M2, the third transistor M3, and the fourth transistor M4 are configured. In this manner, the required functions can be finished by the first transistor M1, the second transistor M2, the third transistor M3, and the fourth transistor M4 under the control of the frequency control signal CRL, and no additional frequency control signal is required, which is conducive to simplifying the circuit structure of the shift register 200 and reducing the complexity of the shift register 200.

For example, as shown in FIGS. 5 and 6, the case where each of the first transistor M1 and the third transistor M3 is a PMOS type transistor, and each of the second transistor M2 and the fourth transistor M4 is an NMOS type transistor is used as an example. When the frequency control signal CRL is at a low level, the first transistor M1 is turned on, the signal of the third node N3 is transmitted to the fourth node N4, the second transistor M2 is turned off, the third transistor M3 is turned on, the signal of the second node N2 is transmitted to the fifth node N5, and the fourth transistor M4 is turned off. In this case, the signal of the fourth node N4 is the signal of the third node N3, the signal of the fifth node N5 is the signal of the second node N2, and the output signal OUT generated by the second control part 20 is determined by the signal of the third node N3 and the signal of the second node N2 controlled by the first control part 10. When the frequency control signal CRL is at a high level, the first transistor M1 is turned off, the second transistor M2 is turned on, the third voltage signal VG11 is transmitted to the fourth node N4, the third transistor M3 is turned off, the fourth transistor M4 is turned on, and the fourth voltage signal VG22 is transmitted to the fifth node N5. In this case, the signal of the fourth node N4 is the third voltage signal VG11, the signal of the fifth node N5 is the fourth voltage signal VG22, and the output signal OUT generated by the second control part 20 is determined by the third voltage signal VG11 and the fourth voltage signal VG22. In this manner, it is achieved that the first transistor M1, the second transistor M2, the third transistor M3, and the fourth transistor M4 control the signal of the fourth node N4 and the signal of the fifth node N5 under the control of the same frequency control signal CRL, and no additional frequency control signal is required, which is conducive to simplifying the circuit structure of the shift register 200 and reducing the complexity of the shift register 200.

Of course, the present disclosure is not limited to this. In other embodiments, as shown in FIGS. 7 and 8, each of the first transistor M1 and the third transistor M3 is an NMOS type transistor, and each of the second transistor M2 and the fourth transistor M4 is a PMOS type transistor. When the frequency control signal CRL is at a high level, the first transistor M1 is turned on, the signal of the third node N3 is transmitted to the fourth node N4, the second transistor M2 is turned off, the third transistor M3 is turned on, the signal of the second node N2 is transmitted to the fifth node N5, and the fourth transistor M4 is turned off. In this case, the signal of the fourth node N4 is the signal of the third node N3, the signal of the fifth node N5 is the signal of the second node N2, and the output signal OUT generated by the second control part 20 is determined by the signal of the third node N3 and the signal of the second node N2 controlled by the first control part 10. When the frequency control signal CRL is at a low level, the first transistor M1 is turned off, the second transistor M2 is turned on, the third voltage signal VG11 is transmitted to the fourth node N4, the third transistor M3 is turned off, the fourth transistor M4 is turned on, and the fourth voltage signal VG22 is transmitted to the fifth node N5. In this case, the signal of the fourth node N4 is the third voltage signal VG11, the signal of the fifth node N5 is the fourth voltage signal VG22, and the output signal OUT generated by the second control part 20 is determined by the third voltage signal VG11 and the fourth voltage signal VG22. In this manner, it is achieved that the first transistor M1, the second transistor M2, the third transistor M3, and the fourth transistor M4 control the signal of the fourth node N4 and the signal of the fifth node N5 under the control of the same frequency control signal CRL, and no additional frequency control signal is required, which is conducive to simplifying the circuit structure of the shift register 200 and reducing the complexity of the shift register 200.

Figure 9:
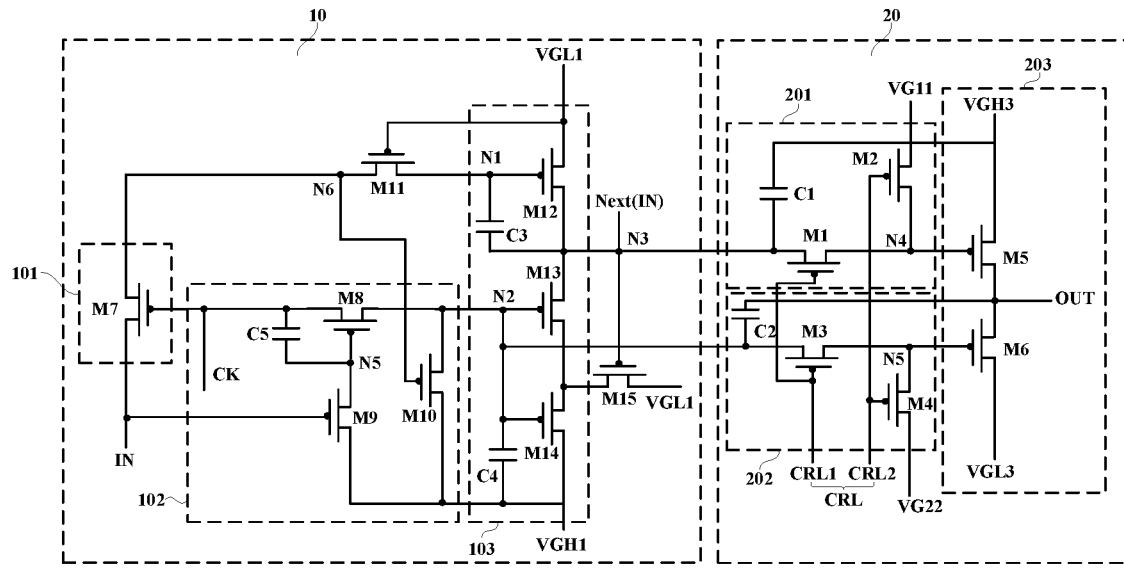
FIG. 9 is a structure diagram of another shift register according to an embodiment of the present disclosure.
Figure 10:
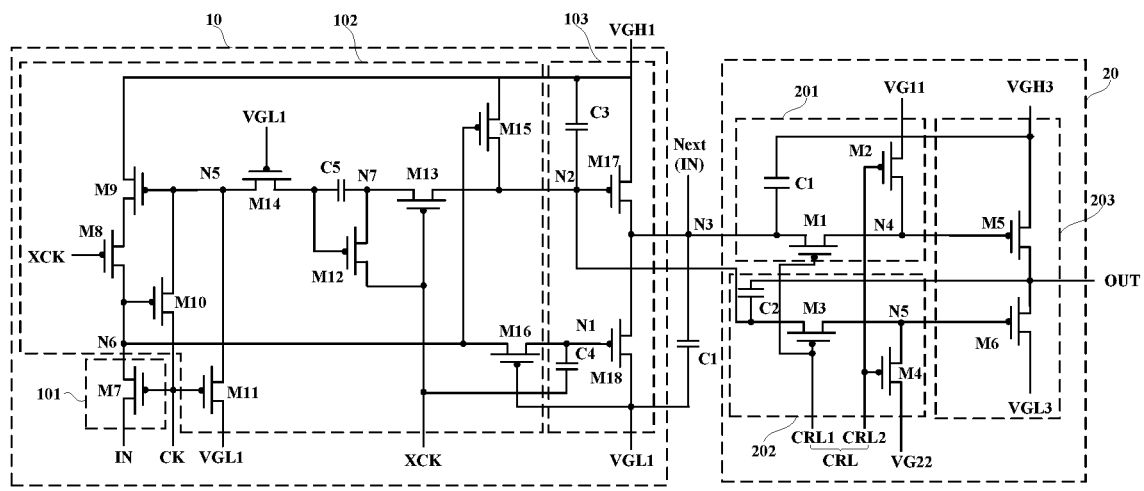
FIG. 10 is a structure diagram of another shift register according to an embodiment of the present disclosure.
Figure 11:
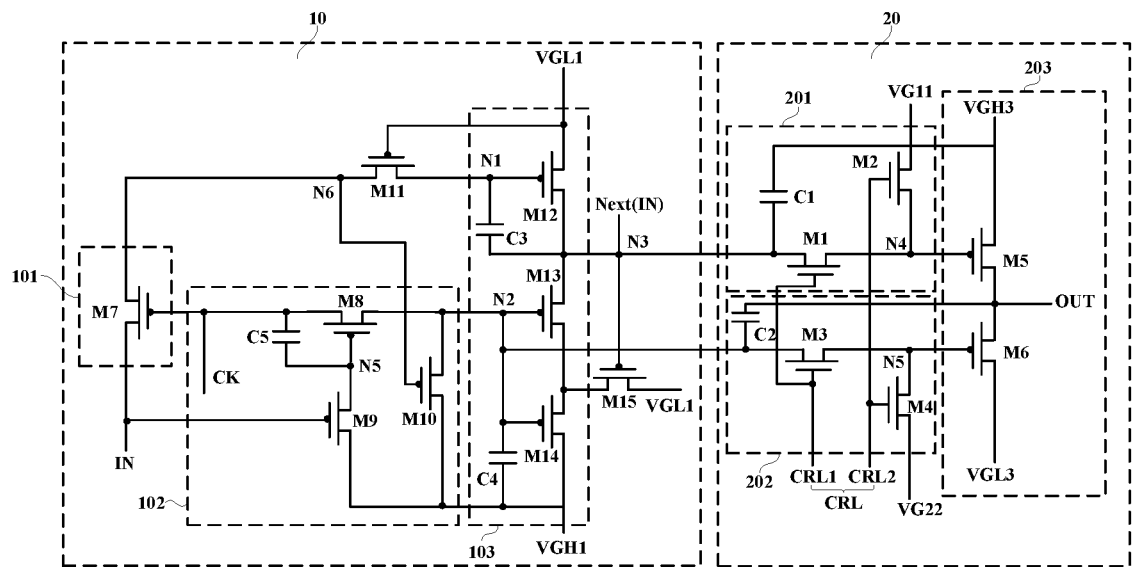
FIG. 11 is a structure diagram of another shift register according to an embodiment of the present disclosure.
Figure 12:
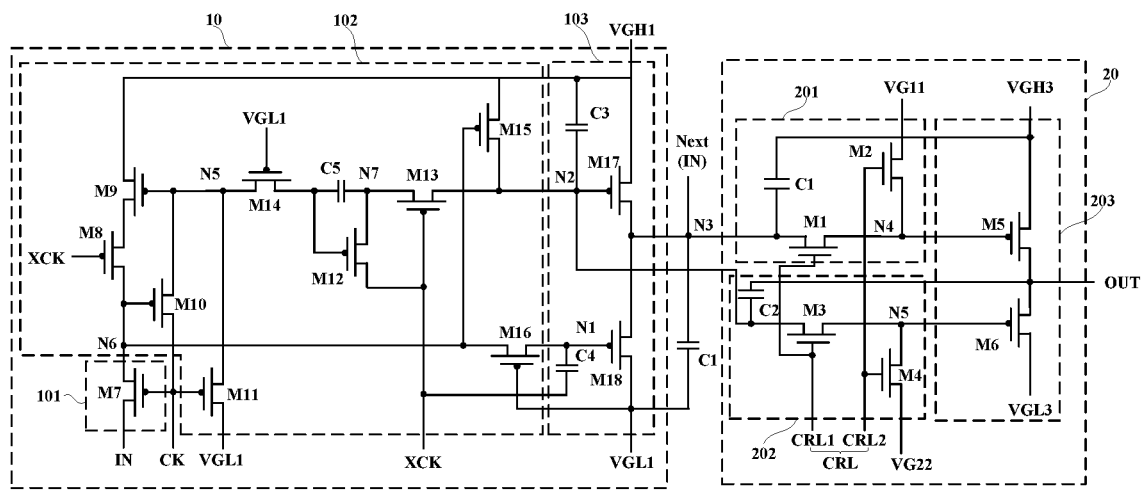
FIG. 12 is a structure diagram of another shift register according to an embodiment of the present disclosure.

FIG. 9 is a structure diagram of another shift register according to an embodiment of the present disclosure, FIG. 10 is a structure diagram of another shift register according to an embodiment of the present disclosure, FIG. 11 is a structure diagram of another shift register according to an embodiment of the present disclosure, and FIG. 12 is a structure diagram of another shift register according to an embodiment of the present disclosure. As shown in FIGS. 9 to 12, in an embodiment, the frequency control signal CRL includes a first sub-control signal CRL1 and a second sub-control signal CRL2, the control terminals of the first transistor M1 and the third transistor M3 receive the first sub-control signal CRL1, and the control terminals of the second transistor M2 and the fourth transistor M4 receive the second sub-control signal CRL2. The first transistor M1, the second transistor M2, the third transistor M3, and the fourth transistor M4 are all PMOS type transistors or are all NMOS type transistors, and the active pulse time of the first sub-control signal CRL1 and the active pulse time of the second sub-control signal CRL2 do not overlap.

The control signal (the first sub-control signal CRL1) received by the control terminals of the first transistor M1 and the third transistor M3 is separated from the control signal (the second sub-control signal CRL2) received by the control terminals of the second transistor M2 and the fourth transistor M4, so that the first transistor M1, the second transistor M2, the third transistor M3, and the fourth transistor M4 can be the same type of transistors, and thus the preparation process can be simplified.

For example, as shown in FIGS. 9 and 10, the case where the first transistor M1, the second transistor M2, the third transistor M3, and the fourth transistor M4 are all PMOS type transistors is used as an example. When the first sub-control signal CRL1 is at a low level and the second sub-control signal CRL2 is at a high level, the first transistor M1 is turned on, the signal of the third node N3 is transmitted to the fourth node N4, the third transistor M3 is turned on, the signal of the second node N2 is transmitted to the fifth node N5, the second transistor M2 is turned off, and the fourth transistor M4 is turned off. In this case, the signal of the fourth node N4 is the signal of the third node N3, the signal of the fifth node N5 is the signal of the second node N2, and the output signal OUT generated by the second control part 20 is determined by the signal of the third node N3 and the signal of the second node N2 controlled by the first control part 10. When the first sub-control signal CRL1 is at a high level and the second sub-control signal CRL2 is at a low level, the first transistor M1 is turned off, the third transistor M3 is turned off, the second transistor M2 is turned on, the third voltage signal VG11 is transmitted to the fourth node N4, the fourth transistor M4 is turned on, and the fourth voltage signal VG22 is transmitted to the fifth node N5. In this case, the signal of the fourth node N4 is the third voltage signal VG11, the signal of the fifth node N5 is the fourth voltage signal VG22, and the output signal OUT generated by the second control part 20 is determined by the third voltage signal VG11 and the fourth voltage signal VG22, so that the signal of the fourth node N4 and the signal of the fifth node N5 can be controlled.

Of course, the present disclosure is not limited to this. In other embodiments, as shown in FIGS. 11 and 12, the first transistor M1, the second transistor M2, the third transistor M3, and the fourth transistor M4 are all NMOS type transistors. When the first sub-control signal CRL1 is at a high level and the second sub-control signal CRL2 is at a low level, the first transistor M1 is turned on, the signal of the third node N3 is transmitted to the fourth node N4, the third transistor M3 is turned on, the signal of the second node N2 is transmitted to the fifth node N5, the second transistor M2 is turned off, and the fourth transistor M4 is turned off. In this case, the signal of the fourth node N4 is the signal of the third node N3, the signal of the fifth node N5 is the signal of the second node N2, and the output signal OUT generated by the second control part 20 is determined by the signal of the third node N3 and the signal of the second node N2 controlled by the first control part 10. When the first sub-control signal CRL1 is at a low level and the second sub-control signal CRL2 is at a high level, the first transistor M1 is turned off, the third transistor M3 is turned off, the second transistor M2 is turned on, the third voltage signal VG11 is transmitted to the fourth node N4, the fourth transistor M4 is turned on, and the fourth voltage signal VG22 is transmitted to the fifth node N5. In this case, the signal of the fourth node N4 is the third voltage signal VG11, the signal of the fifth node N5 is the fourth voltage signal VG22, and the output signal OUT generated by the second control part 20 is determined by the third voltage signal VG11 and the fourth voltage signal VG22, so that the signal of the fourth node N4 and the signal of the fifth node N5 can be controlled.

With continued reference to FIGS. 5 to 12, in an embodiment, the third control unit 203 includes a fifth transistor M5 and a sixth transistor M6. One terminal of the fifth transistor M5 receives the fifth voltage signal VGH3, another terminal of the fifth transistor M5 is connected to an output signal terminal, and a control terminal of the fifth transistor M5 is connected to the fourth node N4. One terminal of the sixth transistor M6 receives the sixth voltage signal VGL3, another terminal of the sixth transistor M6 is connected to the output signal terminal, and a control terminal of the sixth transistor M6 is connected to the fifth node N5. Each of the fifth transistor M5 and the sixth transistor M6 is a PMOS type transistor.

As shown in FIGS. 5 to 12, the fifth transistor M5 controls the output signal OUT in response to the signal of the fourth node N4, and the sixth transistor M6 controls the output signal OUT in response to the signal of the fifth node N5. When the fifth transistor M5 is turned on, the output signal OUT is the fifth voltage signal VGH3, and when the sixth transistor M6 is turned on, the output signal OUT is the sixth voltage signal VGL3.

With continued reference to FIGS. 5 to 12, each of the fifth transistor M5 and the sixth transistor M6 is a PMOS type transistor. When the fourth node N4 is at a low level, the fifth transistor M5 is turned on, the fifth voltage signal VGH3 received by one terminal of the fifth transistor M5 is transmitted to another terminal of the fifth transistor M5, and the output signal OUT is generated. When the fourth node N4 is at a high level, the fifth transistor M5 is turned off. When the fifth node N5 is at a low level, the sixth transistor M6 is turned on, the sixth voltage signal VGL3 received by one terminal of the sixth transistor M6 is transmitted to another terminal of the sixth transistor M6, and the output signal OUT is generated. When the fifth node N5 is at a high level, the sixth transistor M6 is turned off. That is, the high level of the output signal OUT is determined by the fourth node N4, and the low level of the output signal OUT is determined by the fifth node N5.

With continued reference to FIGS. 1 and 2, in an embodiment, the display region AA of the display panel provided in embodiments of the present disclosure includes a first region AA1 and a second region AA2, and the frequency control signal CRL includes a first frequency control signal 1CRL and a second frequency control signal 2CRL. The shift register 200 connected to the display unit 300 in the first region AA1 receives the first frequency control signal 1CRL, and the shift register 200 connected to the display unit 300 in the second region AA2 receives the second frequency control signal 2CRL. The first frequency control signal 1CRL and the second frequency control signal 2CRL are signals of different potentials during the preset time period during which the display panel is operating.

The display region AA includes the first region AA1 and the second region AA2, and the first frequency control signal 1CRL received by the shift register 200 connected to the display unit 300 in the first region AA1 and the second frequency control signal 2CRL received by the shift register 200 connected to the display unit 300 in the second region AA2 are signals of different potentials during the preset time period during which the display panel is operating. In this manner, the output signal OUT of the shift register 200 connected to the display unit 300 in the first region AA1 is different from the output signal OUT of the shift register 200 connected to the display unit 300 in the second region AA2 during at least part of the preset time period during which the display panel is operating, so that the image refresh frequency of the first region AA1 is different from the image refresh frequency of the second region AA2, and thus different requirements of different display regions for the image refresh frequency can be satisfied.

With continued reference to FIGS. 1 and 2, in an embodiment, the data refresh frequency of the display unit 300 in the first region AA1 is a first frequency F1, and the data refresh frequency of the display unit 300 in the second region AA2 is a second frequency F2, where F1<F2. The time length of the preset time period is T0, where 1/F2<T0<1/F1.

In an embodiment, the data refresh frequency of the display unit 300 in the first region AA1 is equal to the image refresh frequency of the first region AA1, and the data refresh frequency of the display unit 300 in the second region AA2 is equal to the image refresh frequency of the second region AA2. The first frequency F1 is less than the second frequency F2, so that the image refresh frequency of the first region AA1 is lower than the image refresh frequency of the second region AA2, that is, the low-frequency display is performed in the first region AA1, and the display cycle of each frame is relatively long; and the high-frequency display is performed in the second region AA2, and the display cycle of each frame is relatively short.

In this embodiment, the data refresh cycle of the display unit 300 in the first region AA1 is 1/F1, and the data refresh cycle of the display unit 300 in the second region AA2 is 1/F2. The time length T0 of the preset time period satisfies 1/F2<T0<1/F1, that is, the time length of the preset time period is between the data refresh cycle of the display unit 300 in the first region AA1 and the data refresh cycle of the display unit 300 in the second region AA2. In this manner, during the preset time period, the first frequency control signal 1CRL does not change, and the second frequency control signal 2CRL changes, so that during the preset time period, the image of the first region AA1 is not refreshed, and only the image of the second region AA2 is refreshed, and thus it is achieved that the data refresh frequency of the display unit 300 in the first region AA1 is less than the data refresh frequency of the display unit 300 in the second region AA2, i.e., the second frequency F2.

In some embodiments, the arbitrarily set the positions of the first region AA1 and the second region AA2 according to actual requirements. For example, as shown in FIGS. 1 and 2, the human eyes are more sensitive to the image displayed in the middle region of the display panel and less sensitive to the image displayed in the peripheral region of the display panel. Therefore, the middle region of the display panel may be set as the second region AA2, and the peripheral region of the display panel may be set as the first region AA1, so that the image refresh frequency of the middle region of the display panel is relatively high, and thus the user requirements are satisfied; and the image refresh frequency of the peripheral region of the display panel is relatively low, and thus the power consumption of the display panel is reduced while the user experience is not affected.

Of course, the present disclosure is not limited to this. In other embodiments, for example, for instrument display products, only the image of the region where the digital part is displayed needs to be refreshed. In this case, the region where the digital part is displayed may be set as the second region AA2, and the other display region may be set as the first region AA1. For e-book display products, only the region where the specific text content of each chapter is displayed may need to be refreshed while the illustration or title part does not need to be refreshed. In this case, the region where the specific text content of each chapter is displayed may be set as the second region AA2, and the region where the illustration or title part is displayed may be set as the first region AA1, so that the power consumption of the display panel is reduced while the user requirements are satisfied, which is not limited in embodiments of the present disclosure.

With continued reference to FIGS. 1 and 2, in an embodiment, the data refresh cycle of the second region AA2 is 1/F2, the data refresh cycle of the first region AA1 is 1/F1, and during one data refresh cycle of the first region AA1, the data of the second region AA2 is refreshed for F2/F1 frames. During one data refresh cycle of the first region AA1, in the M-th frame in which the data of the second region AA2 is refreshed, the first frequency control signal 1CRL and the second frequency control signal 2CRL are signals of the same potential, and in at least one other frame, the first frequency control signal 1CRL and the second frequency control signal 2CRL are signals of different potentials, where $1 \leq M \leq F2/F1$.

During one data refresh cycle (1/F1) of the first region AA1, the data of the second region AA2 is refreshed for F2/F1 frames, and in one of the frames when the data of the second region AA2 is refreshed, the first frequency control signal 1CRL and the second frequency control signal 2CRL are signals of the same potential. In this case, the output signal OUT of the shift register 200 connected to the display unit 300 in the first region AA1 is the same as the output signal OUT of the shift register 200 connected to the display unit 300 in the second region AA2, and the images of the first region AA1 and the second region AA2 are both refreshed in this frame. In at least one other frame, the first frequency control signal 1CRL and the second frequency control signal 2CRL are signals of different potentials, the output signal OUT of the shift register 200 connected to the display unit 300 in the first region AA1 is different from the output signal OUT of the shift register 200 connected to the display unit 300 in the second region AA2, only the second region AA2 is refreshed, and the first region AA1 is not refreshed.

For example, it is assumed that the first frequency F1 is 1 Hz, that is, the first region AA1 is refreshed for 1 frame in 1 s; and the second frequency F2 is 60 Hz, that is, the second region AA2 is refreshed for 60 frames in 1 s. In 1 s, in one frame of the 60 frames when the second region AA2 is refreshed, the first frequency control signal 1CRL and the second frequency control signal 2CRL are signals of the same potential, the output signal OUT of the shift register 200 connected to the display unit 300 in the first region AA1 is the same as the output signal OUT of the shift register 200 connected to the display unit 300 in the second region AA2, and the display units 300 in both the first region AA1 and the second region AA2 perform data refresh. In other 59 frames, the first frequency control signal 1CRL and the second frequency control signal 2CRL are signals of different potentials, the output signal OUT of the shift register 200 connected to the display unit 300 in the first region AA1 is different from the output signal OUT of the shift register 200 connected to the display unit 300 in the second region AA2, only the display unit 300 in the second region AA2 performs data refresh for 59 times, and the display unit 300 in the first region AA1 does not perform data refresh.

With continued reference to FIGS. 1 to 12, in an embodiment, during one data refresh cycle of the first region AA1, in the M-th frame in which the data of the second region AA2 is refreshed, both the first frequency control signal 1CRL and the second frequency control signal 2CRL control the first transistor M1 and the third transistor M3 to be turned on and control the second transistor M2 and the fourth transistor M4 to be turned off. In at least one other frame, the first frequency control signal 1CRL controls the first transistor M1 and the third transistor M3 to be turned off and controls the second transistor M2 and the fourth transistor M4 to be turned on, and the second frequency control signal 2CRL controls the first transistor M1 and the third transistor M3 to be turned on and controls the second transistor M2 and the fourth transistor M4 to be turned off.

In an embodiment, as shown in FIGS. 1 to 12, during one data refresh cycle of the first region AA1, in the M-th frame where the data of the second region AA2 is refreshed (that is, in one frame in which the display units 300 in both the first region AA1 and the second region AA2 perform data refresh), the first frequency control signal 1CRL and the second frequency control signal 2CRL are signals of the same potential, and both the first frequency control signal 1CRL and the second frequency control signal 2CRL control the first transistor M1 and the third transistor M3 to be turned on, so that the signal of the third node N3 is transmitted to the fourth node N4, the signal of the second node N2 is transmitted to the fifth node N5, and the second transistor M2 and the fourth transistor M4 are controlled to be turned off. In this case, the output signal OUT generated by the second control part 20 is determined by the signal of the third node N3 and the signal of the second node N2 controlled by the first control part 10, both the shift register 200 connected to the display unit 300 in the first region AA1 and the shift register 200 connected to the display unit 300 in the second region AA2 perform output normally, and the display units 300 in both the first region AA1 and the second region AA2 perform data refresh.

In at least one other frame, the first frequency control signal 1CRL is different from the second frequency control signal 2CRL, and the second frequency control signal 2CRL controls the first transistor M1 and the third transistor M3 to be turned on, so that the signal of the third node N3 is transmitted to the fourth node N4, the signal of the second node N2 is transmitted to the fifth node N5, and the second transistor M2 and the fourth transistor M4 are controlled to be turned off. In this case, the output signal OUT generated by the second control part 20 is determined by the signal of the third node N3 and the signal of the second node N2 controlled by the first control part 10, the shift register 200 connected to the display unit 300 in the second region AA2 normally outputs an active signal, and the display unit 300 in the second region AA2 performs data refresh. The first frequency control signal 1CRL controls the first transistor M1 and the third transistor M3 to be turned off and controls the second transistor M2 and the fourth transistor M4 to be turned on, so that the third voltage signal VG11 is transmitted to the fourth node N4, and the fourth voltage signal VG22 is transmitted to the fifth node N5. In this case, the output signal OUT generated by the second control part 20 is determined by the third voltage signal VG11 and the fourth voltage signal VG22, the shift register connected to the display unit 300 in the first region AA1 no longer outputs an active signal, and the display unit 300 in the first region AA1 no longer performs data refresh.

Figure 13:
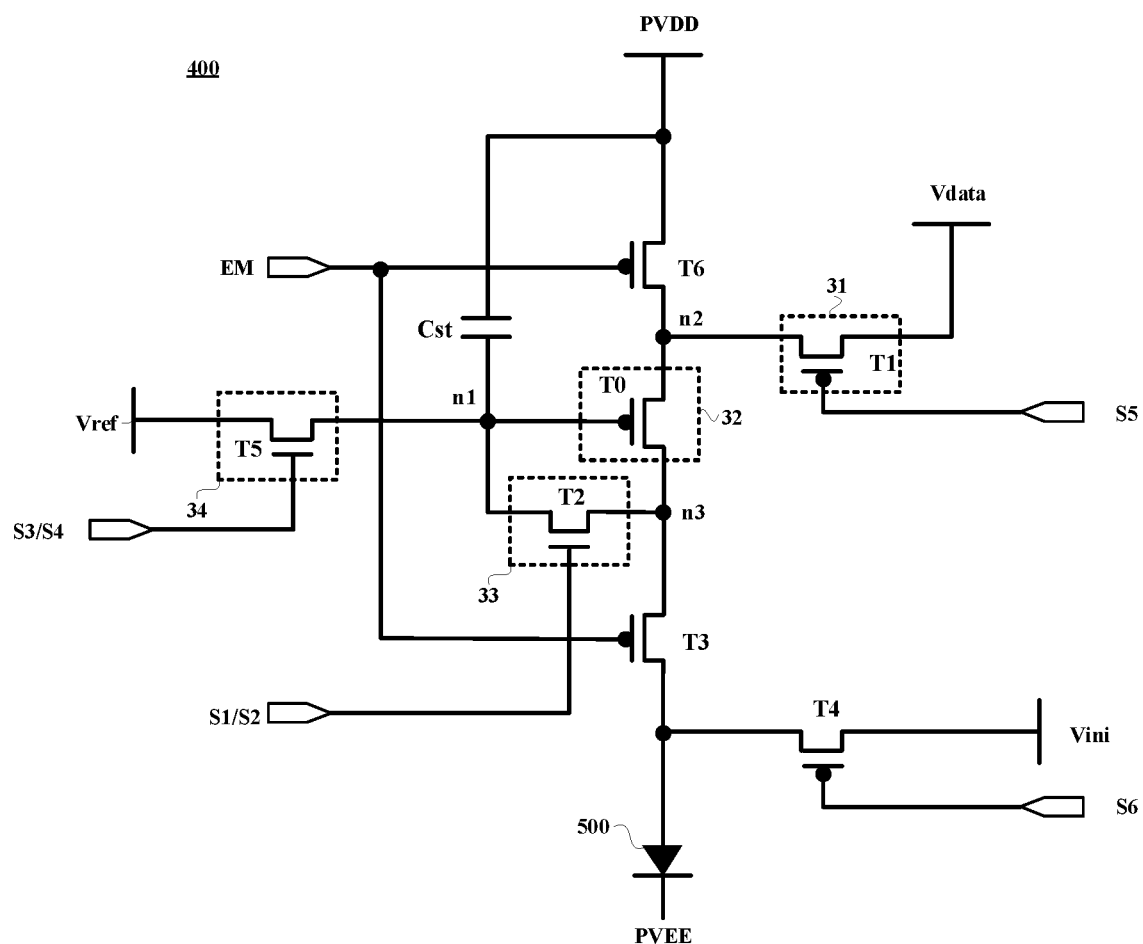
FIG. 13 is a structure diagram of a pixel circuit according to an embodiment of the present disclosure.

FIG. 13 is a structure diagram of a pixel circuit according to an embodiment of the present disclosure. As shown in FIGS. 1 and 13, in an embodiment, the display unit 300 includes the pixel circuit 400 and the light-emitting element 500. The pixel circuit 400 includes a data write module 31, a drive module 32, and a compensation module 33. The drive module 32 is configured to provide a drive current for the light-emitting element 500, and the drive module 32 includes a drive transistor T0. The data write module 31 is connected to a source of the drive transistor T0 and is configured to selectively provide a data signal for the drive module 32. The compensation module 33 is connected between the gate of the drive transistor T0 and the source of the drive transistor T0 and is configured to compensate a threshold voltage of the drive transistor T0. The driving circuit 100 provides a first scanning signal S1 for a control terminal of the compensation module 33 of the display unit 300 in the first region AA1, and the driving circuit 100 provides a second scanning signal S2 for a control terminal of the compensation module 33 of the display unit 300 in the second region AA2. During the preset time period, the first scanning signal S1 controls the compensation module 33 of the display unit 300 in the first region AA1 to be kept off, and during at least part of the preset time period, the second scanning signal S2 controls the compensation module 33 of the display unit 300 in the second region AA2 to be turned on.

In an embodiment, as shown in FIG. 13, the pixel circuit 400 includes the drive transistor T0. Of course, the pixel driving circuit further includes other transistors T1 to T6, a storage capacitor Cst, and other signal input terminals (such as S1 to S6, Vini, Vref, PVDD, PVEE, and so on), which will not be repeated herein.

With continued reference to FIG. 13, the operating process of the pixel circuit 400 includes a data signal voltage write stage and a light emission stage.

In the data signal voltage write stage, the data write module 31 and the compensation module 33 are turned on, and at the same time, the drive transistor T0 is also turned on. A data signal Vdata on a data line passes through the data write module 31, a node n2, the drive transistor TO, a node n3, and the compensation module 33 and is applied to a node n1, so that a data voltage is written into the gate of the drive transistor TO.

In the light emission stage, a light emission control signal EM on a light emission control signal line makes a first light emission control transistor T6 and a second light emission control transistor T3 to be turned on, and the drive transistor T0 provides a drive current for the light-emitting element 500 according to the data voltage written into the gate of the drive transistor TO, so that the drive transistor T0 drives the light-emitting element 500 to emit light.

Every time a data voltage is written into the gate of the drive transistor TO, the display unit 300 where the gate of the drive transistor T0 is located performs data refresh for one time.

In this embodiment, the output signals OUT of the driving circuit 100 are used as the first scanning signal S1 and the second scanning signal S2 received by the control terminal of the compensation module 33 of the display unit 300, the driving circuit 100 provides the first scanning signal S1 for the control terminal of the compensation module 33 of the display unit 300 in the first region AA1, and the driving circuit 100 provides the second scanning signal S2 for the control terminal of the compensation module 33 of the display unit 300 in the second region AA2. During the preset time period, the first scanning signal S1 controls the compensation module 33 of the display unit 300 in the first region AA1 to be kept off, so that the data signal Vdata on the data line cannot write the data voltage into the gate of the drive transistor T0 through the compensation module 33, and the display unit 300 in the first region AA1 does not perform data refresh. During at least part of the preset time period, the second scanning signal S2 controls the compensation module 33 of the display unit 300 in the second region AA2 to be turned on, the data signal Vdata on the data line may write the data voltage into the gate of the drive transistor TO through the compensation module 33, and the display unit 300 in the second region AA2 performs data refresh, so that the data refresh frequency of the display unit 300 in the second region AA2 is greater than the data refresh frequency of the display unit 300 in the first region AA1.

Figure 14:
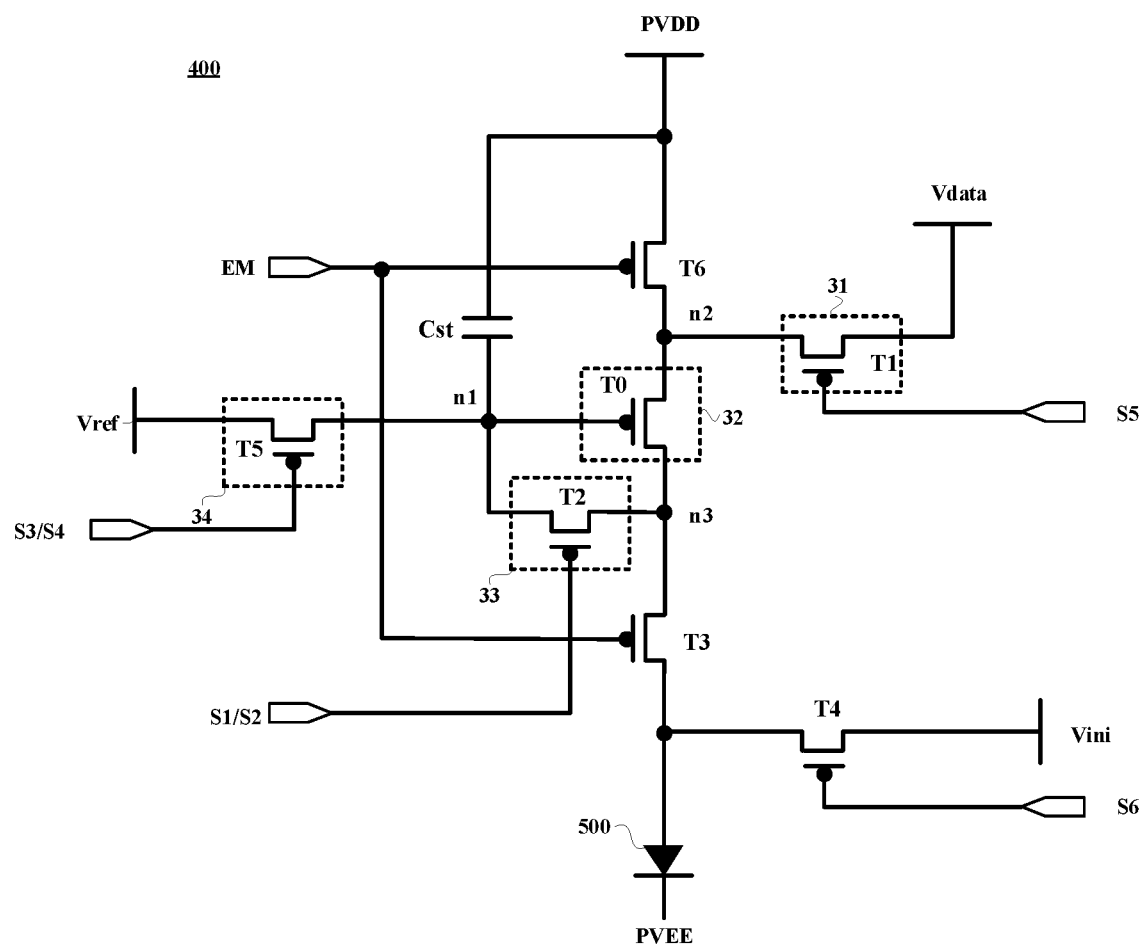
FIG. 14 is a structure diagram of another pixel circuit according to an embodiment of the present disclosure.

FIG. 14 is a structure diagram of another pixel circuit according to an embodiment of the present disclosure. As shown in FIGS. 1, 13, and 14, in an embodiment, the compensation module 33 includes a compensation transistor T2, and a gate of the compensation transistor T2 in the compensation module 33 of the display unit 300 in the first region AA1 is configured to receive the first scanning signal S1, and a gate of the compensation transistor T2 in the compensation module 33 of the display unit 300 in the second region AA2 is configured to receive the second scanning signal S2. The compensation transistor T2 is an NMOS type transistor, the first scanning signal S1 is maintained as a low level signal during the preset time period, and the second scanning signal S2 is a high level signal during at least part of the preset time period. In one embodiment, the compensation transistor T2 is a PMOS type transistor, the first scanning signal S1 is maintained as a high level signal during the preset time period, and the second scanning signal S2 is a low level signal during at least part of the preset time period.

The compensation transistor T2 may be set as an NMOS type transistor or a PMOS type transistor. In this embodiment, the first scanning signal S1 and the second scanning signal S2 are correspondingly set for different types of transistors to control the data refresh frequencies of the display units 300 in different regions, which will be described in detail below with some embodiments.

For example, as shown in FIG. 13, the case where the compensation transistor T2 is an NMOS type transistor is used as an example. The gate of the compensation transistor T2 of the display unit 300 in the first region AA1 is configured to receive the first scanning signal S1, and during the preset time period, the first scanning signal S1 is maintained as a low level signal, and the compensation transistor T2 is kept off, so that the data signal Vdata on the data line cannot write the data voltage into the gate of the drive transistor T0 through the compensation transistor T2, and the display unit 300 in the first region AA1 does not perform data refresh. The gate of the compensation transistor T2 of the display unit 300 in the second region AA2 is configured to receive the second scanning signal S2, and during at least part of the preset time period, the second scanning signal S2 is a high level signal, the compensation transistor T2 is turned on, the data signal Vdata on the data line may write the data voltage into the gate of the drive transistor TO through the compensation module 33, and the display unit 300 in the second region AA2 performs data refresh. In this manner, the data refresh frequency of the display unit 300 in the second region AA2 is greater than the data refresh frequency of the display unit 300 in the first region AA1.

Of course, the present disclosure is not limited to this. In other embodiments, as shown in FIG. 14, the compensation transistor T2 is an PMOS type transistor, the gate of the compensation transistor T2 of the display unit 300 in the first region AA1 is configured to receive the first scanning signal S1, and during the preset time period, the first scanning signal S1 is maintained as a high level signal, and the compensation transistor T2 is kept off, so that the data signal Vdata on the data line cannot write the data voltage into the gate of the drive transistor T0 through the compensation transistor T2, and the display unit 300 in the first region AA1 does not perform data refresh. The gate of the compensation transistor T2 of the display unit 300 in the second region AA2 is configured to receive the second scanning signal S2, and during at least part of the preset time period, the second scanning signal S2 is a low level signal, the compensation transistor T2 is turned on, the data signal Vdata on the data line may write the data voltage into the gate of the drive transistor T0 through the compensation module 33, and the display unit 300 in the second region AA2 performs data refresh. In this manner, the data refresh frequency of the display unit 300 in the second region AA2 is greater than the data refresh frequency of the display unit 300 in the first region AA1.

With continued reference to FIGS. 1 to 14, in an embodiment, the third voltage signal VG11 is a high level signal, the fourth voltage signal VG22 is a low level signal, and the compensation module 33 is an NMOS type transistor; or the third voltage signal VG11 is a low level signal, the fourth voltage signal VG22 is a high level signal, and the compensation module 33 is a PMOS type transistor.

In this embodiment, based on different types of transistors in the compensation module 33, the potentials of the third voltage signal VG11 and the fourth voltage signal VG22 in the driving circuit 100 are configured. In this manner, the output signal OUT of the driving circuit 100 satisfies the turn-on and turn-off requirements of the compensation module 33, so that the data refresh frequency of the display unit 300 in the second region AA2 is greater than the data refresh frequency of the display unit 300 in the first region AA1, which will be described in detail below with some embodiments.

For example, as shown in FIGS. 1 to 13, the case where the third voltage signal VG11 is a high level signal, the fourth voltage signal VG22 is a low level signal, and the compensation module 33 is an NMOS type transistor is used as an example. During the preset time period, the first frequency control signal 1CRL controls the first transistor M1 and the third transistor M3 in part of the shift registers 200 to be turned off and controls the second transistor M2 and the fourth transistor M4 in the part of the shift registers 200 to be turned on, so that the third voltage signal VG11 is transmitted to the fourth node N4, and the fourth voltage signal VG22 is transmitted to the fifth node N5. The third voltage signal VG11 is a high level signal, the fourth voltage signal VG22 is a low level signal, the fifth transistor M5 is turned off, the sixth transistor M6 is turned on, the generated output signal OUT is the sixth voltage signal VGL3 (that is, a low level signal), the output signals OUT of the part of the shift registers 200 are used as the first scanning signals S1, and the gate of the compensation transistor T2 of the display unit 300 in the first region AA1 is configured to receive the first scanning signal S1. Therefore, during the preset time period, the first scanning signal S1 is maintained as a low level signal, and the compensation transistor T2 is kept off, so that the data signal Vdata on the data line cannot write the data voltage into the gate of the drive transistor through the compensation transistor T2, and thus the display unit 300 in the first region AA1 stops performing data refresh.

During at least part of the preset time period, the second frequency control signal 2CRL controls the first transistors M1 and the third transistors M3 in part of the shift registers 200 to be turned on, so that the signal of the third node N3 is transmitted to the fourth node N4, the signal of the second node N2 is transmitted to the fifth node N5, and the second transistor M2 and the fourth transistor M4 are controlled to be turned off. In this case, the signal of the third node N3 and the signal of the second node N2 controlled by the first control part 10 controls the fifth transistor M5 to be turned on and controls the sixth transistor M6 to be turned off, the generated output signal OUT is the fifth voltage signal VGH3 (that is, a high level signal), the output signals OUT of the part of the shift registers 200 are used as the second scanning signals S2, and the gate of the compensation transistor T2 of the display unit 300 in the second region AA2 is configured to receive the second scanning signal S2. In this manner, during at least part of the preset time period, the second scanning signal S2 is a high level signal, and the compensation transistor T2 is turned on, so that the data signal Vdata on the data line writes the data voltage into the gate of the drive transistor T0 through the compensation transistor T2, and the display unit 300 in the second region AA2 performs data refresh.

Of course, the present disclosure is not limited to this. In other embodiments, as shown in FIGS. 1 to 12 and FIG. 14, the case where the third voltage signal VG11 is a low level signal, the fourth voltage signal VG22 is a high level signal, and the compensation module 33 is a PMOS type transistor is used as an example. During the preset time period, the first frequency control signal 1CRL controls the first transistors M1 and the third transistors M3 in part of the shift registers 200 to be turned off and controls the second transistors M2 and the fourth transistors M4 in the part of the shift registers 200 to be turned on, so that the third voltage signal VG11 is transmitted to the fourth node N4, and the fourth voltage signal VG22 is transmitted to the fifth node N5. The third voltage signal VG11 is a low level signal, the fourth voltage signal VG22 is a high level signal, the fifth transistor M5 is turned on, the sixth transistor M6 is turned off, the generated output signal OUT is the fifth voltage signal VGH3 (that is, a high level signal), the output signals OUT of the part of the shift registers 200 are used as the first scanning signals S1, and the gate of the compensation transistor T2 of the display unit 300 in the first region AA1 is configured to receive the first scanning signal S1. Therefore, during the preset time period, the first scanning signal S1 is maintained as a high level signal, and the compensation transistor T2 is kept off, so that the data signal Vdata on the data line cannot write the data voltage into the gate of the drive transistor T0 through the compensation transistor T2, and thus the display unit 300 in the first region AA1 stops performing data refresh.

During at least part of the preset time period, the second frequency control signal 2CRL controls the first transistors M1 and the third transistors M3 in part of the shift registers 200 to be turned on, so that the signal of the third node N3 is transmitted to the fourth node N4, the signal of the second node N2 is transmitted to the fifth node N5, and the second transistor M2 and the fourth transistor M4 are controlled to be turned off. In this case, the signal of the third node N3 and the signal of the second node N2 controlled by the first control part 10 controls the fifth transistor M5 to be turned off and controls the sixth transistor M6 to be turned on, the generated output signal OUT is the sixth voltage signal VGL3 (that is, a low level signal), the output signal s OUT of the part of the shift registers 200 are used as the second scanning signals S2, and the gate of the compensation transistor T2 of the display unit 300 in the second region AA2 is configured to receive the second scanning signal S2. In this manner, during at least part of the preset time period, the second scanning signal S2 is a low level signal, and the compensation transistor T2 is turned on, so that the data signal Vdata on the data line writes the data voltage into the gate of the drive transistor T0 through the compensation transistor T2, and the display unit 300 in the second region AA2 performs data refresh.

With continued reference to FIGS. 13 and 14, in an embodiment, the pixel circuit 400 further includes a reset module 34, and the reset module 34 is connected between a reset signal terminal and the gate of the drive transistor T0 and is configured to provide a reset signal Vref for the gate of the drive transistor T0. The driving circuit 100 provides a third scanning signal S3 for a control terminal of the reset module 34 of the display unit 300 in the first region AA1, and the driving circuit 100 provides a fourth scanning signal S4 for a control terminal of the reset module 34 of the display unit 300 in the second region AA2. During the preset time period, the third scanning signal S3 controls the reset module 34 of the display unit 300 in the first region AA1 to be kept off, and during at least part of the preset time period, the third scanning signal S3 and the fourth scanning signal S4 are signals of different potentials.

In an embodiment, the operating process of the pixel circuit 400 further includes an initialization stage. In the initialization stage, the reset module 34 is turned on, and the reset signal Vref on a reference voltage line is applied to the gate of the drive transistor T0 through the reset module 34, that is, the potential of the node n1 is the potential of the reset signal Vref. In this case, the potential of the gate of the drive transistor T0 is also the potential of the reset signal Vref, so that the gate potential of the drive transistor T0 is reset.

The drive transistor T0 provides a drive current for the light-emitting element 500 according to the gate potential of the drive transistor TO, the gate potential of the drive transistor TO is not reset, and the display brightness of the display unit 300 where the drive transistor T0 is located is kept unchanged.

In this embodiment, the output signals OUT of the driving circuit 100 are used as the third scanning signal S3 and the fourth scanning signal S4 received by the control terminal of the reset module 34 of the display unit 300, the driving circuit 100 provides the third scanning signal S3 for the control terminal of the reset module 34 of the display unit 300 in the first region AA1, and the driving circuit 100 provides the fourth scanning signal S4 for the control terminal of the reset module 34 of the display unit 300 in the second region AA2. During the preset time period, the third scanning signal S3 controls the reset module 34 of the display unit 300 in the first region AA1 to be kept off, so that the reset signal Vref cannot reset the gate of the drive transistor TO through the reset module 34, the display brightness of the display unit 300 in the first region AA1 is kept unchanged, and the image refresh is not performed. During at least part of the preset time period, the fourth scanning signal S4 and the third scanning signal S3 are signals of different potentials, the fourth scanning signal S4 controls the reset module 34 of the display unit 300 in the second region AA2 to be turned on, the reset signal Vref resets the gate of the drive transistor TO through the reset module 34, and the display unit 300 in the second region AA2 may perform the image refresh, so that a gate reset frequency of the drive transistor T0 of the display unit 300 in the second region AA2 is greater than a gate reset frequency of the drive transistor T0 of the display unit 300 in the first region AA1, and thus it is achieved that the image refresh frequency of the second region AA2 is greater than the image refresh frequency of the first region AA1.

With continued reference to FIGS. 13 and 14, in an embodiment, the reset module 34 includes a reset transistor T5, a gate of the reset transistor T5 in the reset module 34 of the display unit 300 in the first region AA1 is configured to receive the third scanning signal S3, and a gate of the reset transistor T5 in the reset module 34 of the display unit 300 in the second region AA2 is configured to receive the fourth scanning signal S4. The reset transistor T5 is an NMOS type transistor, the third voltage signal VG11 is a high level signal, and the fourth voltage signal VG22 is a low level signal. During the preset time period, the third scanning signal S3 is maintained as a low level signal, and during at least part of the preset time period, the fourth scanning signal S4 is a high level signal. In one embodiment, the reset transistor T5 is a PMOS type transistor, the third voltage signal VG11 is a low level signal, and the fourth voltage signal VG22 is a high level signal; during the preset time period, the third scanning signal S3 is maintained as a high level signal; and during at least part of the preset time period, the fourth scanning signal S4 is a low level signal.

The reset transistor T5 may be set as an NMOS type transistor or a PMOS type transistor. In this embodiment, the third scanning signal S3 and the fourth scanning signal S4 are correspondingly set for different types of transistors to control the gate reset frequencies of the drive transistors T0 of the display units 300 in different regions. In addition, based on different transistor types of the reset transistors T5, the potentials of the third voltage signal VG11 and the fourth voltage signal VG22 in the driving circuit 100 are configured. In this manner, the output signal OUT of the driving circuit 100 satisfies the turn-on and turn-off requirements of the reset transistor T5, so that the gate reset frequency of the display unit 300 in the second region AA2 is greater than the gate reset frequency of the display unit 300 in the first region AA1, which will be described in detail below with some embodiments.

For example, as shown in FIGS. 1 to 13, the case where the reset transistor T5 is an NMOS type transistor, the third voltage signal VG11 is a high level signal, and the fourth voltage signal VG22 is a low level signal is used as an example. During the preset time period, the first frequency control signal 1CRL controls the first transistors M1 and the third transistors M3 in part of the shift registers 200 to be turned off and controls the second transistors M2 and the fourth transistors M4 in the part of the shift registers 200 to be turned on, so that the third voltage signal VG11 is transmitted to the fourth node N4, and the fourth voltage signal VG22 is transmitted to the fifth node N5. The third voltage signal VG11 is a high level signal, the fourth voltage signal VG22 is a low level signal, the fifth transistor M5 is turned off, the sixth transistor M6 is turned on, the generated output signal OUT is the sixth voltage signal VGL3 (that is, a low level signal), the output signals OUT of the part of the shift registers 200 are used as the third scanning signals S3, and the gate of the reset transistor T5 of the display unit 300 in the first region AA1 is configured to receive the third scanning signal S3. Therefore, during the preset time period, the third scanning signal S3 is maintained as a low level signal, and the reset transistor T5 is kept off, so that the reset signal Vref cannot reset the gate of the drive transistor T0 through the reset module 34, the display brightness of the display unit 300 in the first region AA1 is kept unchanged, and the image refresh is stopped.

During at least part of the preset time period, the second frequency control signal 2CRL controls the first transistors M1 and the third transistors M3 in part of the shift registers 200 to be turned on, so that the signal of the third node N3 is transmitted to the fourth node N4, the signal of the second node N2 is transmitted to the fifth node N5, and the second transistor M2 and the fourth transistor M4 are controlled to be turned off. In this case, the signal of the third node N3 and the signal of the second node N2 controlled by the first control part 10 controls the fifth transistor M5 to be turned on and controls the sixth transistor M6 to be turned off, the generated output signal OUT is the fifth voltage signal VGH3 (that is, a high level signal), the output signals OUT of the part of the shift registers 200 are used as the fourth scanning signals S4, and the gate of the reset transistor T5 of the display unit 300 in the second region AA2 is configured to receive the fourth scanning signal S4. In this manner, during at least part of the preset time period, the fourth scanning signal S4 is a high level signal, and the reset transistor T5 is turned on, so that the reset signal Vref resets the gate of the drive transistor T0 through the reset module 34, and the display unit 300 in the second region AA2 performs the image refresh.

Of course, the present disclosure is not limited to this. In other embodiments, as shown in FIGS. 1 to 12 and FIG. 14, the reset transistor T5 is a PMOS type transistor, the third voltage signal VG11 is a low level signal, and the fourth voltage signal VG22 is a high level signal. During the preset time period, the first frequency control signal 1CRL controls the first transistors M1 and the third transistors M3 in part of the shift registers 200 to be turned off and controls the second transistors M2 and the fourth transistors M4 in the part of the shift registers 200 to be turned on, so that the third voltage signal VG11 is transmitted to the fourth node N4, and the fourth voltage signal VG22 is transmitted to the fifth node N5. The third voltage signal VG11 is a low level signal, the fourth voltage signal VG22 is a high level signal, the fifth transistor M5 is turned on, the sixth transistor M6 is turned off, the generated output signal OUT is the fifth voltage signal VGH3 (that is, a high level signal), the output signals OUT of the part of the shift registers 200 are used as the third scanning signals S3, and the gate of the reset transistor T5 of the display unit 300 in the first region AA1 is configured to receive the third scanning signal S3. Therefore, during the preset time period, the third scanning signal S3 is maintained as a high level signal, and the reset transistor T5 is kept off, so that the reset signal Vref cannot reset the gate of the drive transistor T0 through the reset module 34, the display brightness of the display unit 300 in the first region AA1 is kept unchanged, and the image refresh is stopped.

During at least part of the preset time period, the second frequency control signal 2CRL controls the first transistors M1 and the third transistors M3 in part of the shift registers 200 to be turned on, so that the signal of the third node N3 is transmitted to the fourth node N4, the signal of the second node N2 is transmitted to the fifth node N5, and the second transistor M2 and the fourth transistor M4 are controlled to be turned off. In this case, the signal of the third node N3 and the signal of the second node N2 controlled by the first control part 10 controls the fifth transistor M5 to be turned off and controls the sixth transistor M6 to be turned on, the generated output signal OUT is the sixth voltage signal VGL3 (that is, a low level signal), the output signals OUT of the part of the shift registers 200 are used as the fourth scanning signals S4, and the gate of the reset transistor T5 of the display unit 300 in the second region AA2 is configured to receive the fourth scanning signal S4. In this manner, during at least part of the preset time period, the fourth scanning signal S4 is a low level signal, and the reset transistor T5 is turned on, so that the reset signal Vref resets the gate of the drive transistor T0 through the reset module 34, and the display unit 300 in the second region AA2 performs the image refresh.

With continued reference to FIGS. 3, 5, 7, 9, and 11, in an embodiment, the first control part 10 includes a fourth control unit 101, a fifth control unit 102, and a sixth control unit 103. The fourth control unit 101 is configured to receive the input signal IN and control a signal of a sixth node N6 in response to the first clock signal CK, where the sixth node N6 is connected to the first node N1. The fifth control unit 102 is configured to receive the first voltage signal VGH1 and control the signal of the second node N2 in response to the input signal IN and the signal of the sixth node N6. The sixth control unit 103 is configured to receive the first voltage signal VGH1 and the second voltage signal VGL1 and control the signal of the third node N3 in response to the signal of the first node N1 and the signal of the second node N2.

For example, as shown in FIGS. 5, 7, 9, and 11, the fourth control unit 101 may include a seventh transistor M7, a source of the seventh transistor M7 is connected to the input signal IN, a drain of the seventh transistor M7 is connected to the sixth node N6, and a gate of the seventh transistor M7 is connected to the first clock signal CK.

Based on any one of the preceding embodiments, in some embodiments of the present disclosure, as shown in FIGS. 5, 7, 9, and 11, the fifth control unit 102 includes an eighth transistor M8, a ninth transistor M9, a tenth transistor M10, and a fifth capacitor C5. A source of the eighth transistor M8 is connected to the first clock signal CK, a drain of the eighth transistor M8 is connected to the second node N2, and a gate of the eighth transistor M8 is connected to the fifth node N5; a source of the ninth transistor M9 is connected to the first voltage signal VGH1, a drain of the ninth transistor M9 is connected to the fifth node N5, and a gate of the ninth transistor M9 is connected to the input signal IN; a source of the tenth transistor M10 is connected to the first voltage signal VGH1, a drain of the tenth transistor M10 is connected to the second node N2, and a gate of the tenth transistor M10 is connected to the sixth node N6; and a first electrode plate of the fifth capacitor C5 is connected to the first clock signal CK, and a second electrode plate of the fifth capacitor C5 is connected to the fifth node N5.

Based on any one of the preceding embodiments, in some embodiments of the present disclosure, as shown in FIGS. 5, 7, 9, and 11, the sixth control unit 103 includes a twelfth transistor M12 and a thirteenth transistor M13, where a source of the twelfth transistor M12 is connected to the second voltage signal VGL1, a drain of the twelfth transistor M12 is connected to the third node N3, and a gate of the twelfth transistor M12 is connected to the first node N1; and a source of the thirteenth transistor M13 is connected to the first voltage signal VGH1, a drain of the thirteenth transistor M13 is connected to the third node N3, and a gate of the thirteenth transistor M13 is connected to the second node N2.

Based on any one of the preceding embodiments, in some embodiments of the present disclosure, as shown in FIGS. 5, 7, 9, and 11, the sixth control unit 103 further includes a third capacitor C3 and a fourth capacitor C4, where a first electrode plate of the third capacitor C3 is connected to the first node N1, and a second electrode plate of the third capacitor C3 is connected to the third node N3; and a first electrode plate of the fourth capacitor C4 is connected to the second node N2, and a second electrode plate of the fourth capacitor C4 is connected to the first voltage signal VGH1.

Based on any one of the preceding embodiments, in some embodiments of the present disclosure, as shown in FIGS. 5, 7, 9, and 11, the shift register 200 further includes a fourteenth transistor M14 and a fifteenth transistor M15. A source of the fourteenth transistor M14 is connected to the first voltage signal VGH1, a drain of the fourteenth transistor M14 is connected to the source of the thirteenth transistor M13, and a gate of the fourteenth transistor M14 is connected to the second node N2; and a source of the sixth transistor M6 is connected to the second voltage signal VGL1, a drain of the sixth transistor M6 is connected to the source of the thirteenth transistor M13, and a gate of the sixth transistor M6 is connected to the third node N3.

The operating process of the shift register shown in FIGS. 5, 7, 9, and 11 will be described below in conjunction with the timing sequence diagram of each signal in the shift register.

Figure 15:
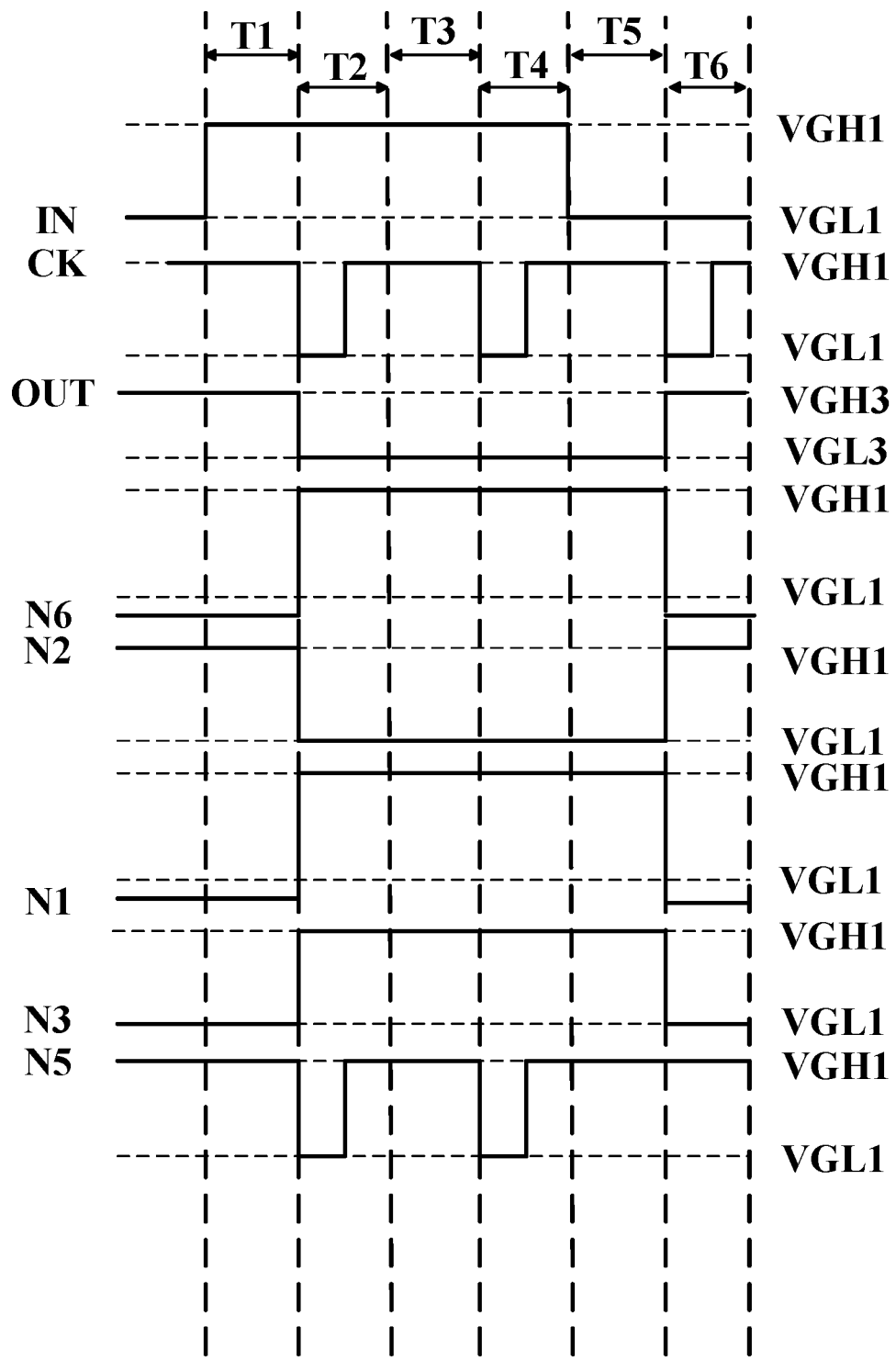
FIG. 15 is a timing sequence diagram of signals of nodes of a shift register according to an embodiment of the present disclosure.

FIG. 15 is a timing sequence diagram of signals of nodes of a shift register according to an embodiment of the present disclosure. As shown in FIG. 15, in a T1 stage, the input signal IN is at a high level, the first clock signal CK is at a high level, the seventh transistor M7 and the ninth transistor M9 are turned off, the fifth node N5 is maintained at a high level, the sixth node N6 is maintained at a low level, the tenth transistor M10 is turned on, and the first voltage signal VGH1 is transmitted to the second node N2. In this manner, the second node N2 is at a high level, so that the thirteenth transistor M13, the fourteenth transistor M14, and the sixth transistor M6 are turned off. Since M11 is normally on, the level of the first node N1 and the level of the sixth node N6 are the same and are both low, so that the twelfth transistor M12 is turned on, and the second voltage signal VGL1 is transmitted to the third node N3; the third node N3 is at a low level; the fifth transistor M5 is turned on, and the fifth voltage signal VGH3 is transmitted to an output terminal; and the output signal OUT is at a high level.

In a T2 stage, the input signal IN is at a high level, the first clock signal CK is at a low level, the seventh transistor M7 is turned on, and the input signal IN is transmitted to the sixth node N6, so that the sixth node N6 is at a high level; the first node N1 is at a high level, and the twelfth transistor M12 is turned off; under the action of the fifth capacitor C5, the fifth node N5 is at a low level, the eighth transistor M8 is turned on, and the first clock signal CK is transmitted to the second node N2; the second node N2 is at a low level, the thirteenth transistor M13, the fourteenth transistor M14, and the sixth transistor M6 are turned on, and the first voltage signal VGH1 is transmitted to the third node N3; the third node N3 is at a high level; the fifth transistor M5 is turned off, and the turned-on sixth transistor M6 transmits the sixth voltage signal VGL3 to the output terminal; and the output signal OUT is at a low level.

In a T3 stage, the input signal IN is at a high level, and the first clock signal CK is at a high level; under the action of the fifth capacitor C5, the fifth node N5 is at a high level, the seventh transistor M7 is turned off, the sixth node N6 is maintained at a high level, the first node N1 is maintained at a high level, the eighth transistor M8 and the tenth transistor M10 are turned off, the second node N2 is maintained at a low level, the third node N3 is maintained at a high level, the fifth transistor M5 is kept off, the sixth transistor M6 is kept on, and the output signal OUT is at a low level.

In a T4 stage, the input signal IN is at a high level, the first clock signal CK is at a low level, the seventh transistor M7 is turned on, and the input signal IN is transmitted to the sixth node N6, so that the sixth node N6 is maintained at a high level, and the first node N1 is maintained at a high level; under the action of the fifth capacitor C5, the fifth node N5 is at a low level, the eighth transistor M8 is turned on, and the first clock signal CK is transmitted to the second node N2; and the second node N2 is maintained at a low level, the third node N3 is maintained at a high level, and the output signal OUT is maintained at a low level.

In a T5 stage, the input signal IN is at a low level, the first clock signal CK is at a high level, the seventh transistor M7 is turned off, the sixth node N6 is maintained at a high level, the first node N1 is maintained at a high level, the ninth transistor M9 is turned on, and the first voltage signal VGH1 is transmitted to the fifth node N5. In this manner, the fifth node N5 is at a high level, so that the second node N2 is maintained at a low level, the third node N3 is maintained at a high level, and the output signal OUT is maintained at a low level.

In a T6 stage, the input signal IN is at a low level, the first clock signal CK is at a low level, the seventh transistor M7 and the ninth transistor M9 are turned on, and the turned-on seventh transistor M7 transmits the input signal IN to the sixth node N6, so that the sixth node N6 is at a low level, the first node N1 is at a low level, and the turned-on ninth transistor M9 transmits the first voltage signal VGH1 to the fifth node N5; the fifth node N5 is at a high level, the eighth transistor M8 is turned off, and the turned-on tenth transistor M10 transmits the first voltage signal VGH1 to the second node N2; the second node N2 is at a high level; the thirteenth transistor M13, the fourteenth transistor M14, and the sixth transistor M6 are turned off, the twelfth transistor M12 is turned on, and the second voltage signal VGL1 is transmitted to the third node N3; and the third node N3 is at a low level. The turned-on fifth transistor M5 transmits the fifth voltage signal VGH3 to the output terminal, so that the output signal OUT is at a high level.

It is to be noted that the operating process of the preceding shift register only shows the potential of the output signal OUT in the case where the output signal OUT is controlled by the signal of the third node N3 and the signal of the second node N2 controlled by the first control part 10 (that is, the first transistor M1 and the third transistor M3 are turned on, and the second transistor M2 and the fourth transistor M4 are turned off). When the frequency control signal CRL controls the first transistor M1 and the third transistor M3 to be turned off and controls the second transistor M2 and the fourth transistor M4 to be turned on, the output signal OUT is controlled by the third voltage signal VG11 and the fourth voltage signal VG22, which will not be repeated here.

Of course, the present disclosure is not limited to this. In other embodiments, as shown in FIGS. 4, 6, 8, 10, and 12, in an embodiment, the first control part 10 includes the fourth control unit 101, the fifth control unit 102, and the sixth control unit 103. The fourth control unit 101 is configured to receive the input signal IN and control the signal of the sixth node N6 in response to the first clock signal CK, where the sixth node N6 is connected to the first node N1. The fifth control unit 102 is configured to receive the first voltage signal VGH1 and the second voltage signal VGL1 and control the signal of the second node N2 in response to the signal of the sixth node N6, the first clock signal CK, and a second clock signal XCK. The sixth control unit 103 is configured to receive the first voltage signal VGH1 and the second voltage signal VGL1 and control the signal of the third node N3 in response to the signal of the first node N1 and the signal of the second node N2.

For example, as shown in FIGS. 6, 8, 10, and 12, the fourth control unit 101 includes the seventh transistor M7, the source of the seventh transistor M7 is connected to the input signal IN, the drain of the seventh transistor M7 is connected to the sixth node N6, and the gate of the seventh transistor M7 is connected to the first clock signal CK.

Based on any one of the preceding embodiments, in some embodiments of the present disclosure, as shown in FIGS. 6, 8, 10, and 12, the fifth control unit 102 includes an eighth transistor M8, a ninth transistor M9, a tenth transistor M10, an eleventh transistor M11, a twelfth transistor M12, a thirteenth transistor M13, a fifteenth transistor M15, and a fifth capacitor C5. A source of the eighth transistor M8 is connected to the sixth node N6, a drain of the eighth transistor M8 is connected to a drain of the ninth transistor M9, and a gate of the eighth transistor M8 is connected to the second clock signal XCK. A source of the ninth transistor M9 is connected to the first voltage signal VGH1, a drain of the ninth transistor M9 is connected to the drain of the eighth transistor M8, and a gate of the ninth transistor M9 is connected to the fifth node N5. A source of the tenth transistor M10 is connected to the first clock signal CK, a drain of the tenth transistor M10 is connected to the fifth node N5, and a gate of the tenth transistor M10 is connected to the sixth node N6. A source of the eleventh transistor M11 is connected to the second voltage signal VGL1, a drain of the eleventh transistor M11 is connected to the fifth node N5, and a gate of the eleventh transistor M11 is connected to the first clock signal CK. A source of the twelfth transistor M12 is connected to the second clock signal XCK, a drain of the twelfth transistor M12 is connected to the seventh node N7, and a gate of the twelfth transistor M12 is connected to the fifth node N5. A source of the thirteenth transistor M13 is connected to the seventh node N7, a drain of the thirteenth transistor M13 is connected to the second node N2, and a gate of the thirteenth transistor M13 is connected to the second clock signal XCK. A source of the fifteenth transistor M15 is connected to the first voltage signal VGH1, a drain of the fifteenth transistor M15 is connected to the second node N2, and a gate of the fifteenth transistor M15 is connected to the first node N1. A first electrode plate of the fifth capacitor C5 is connected to the fifth node N5, and a second electrode plate of the fifth capacitor C5 is connected to the seventh node N7.

Based on any one of the preceding embodiments, in some embodiments of the present disclosure, as shown in FIGS. 6, 8, 10, and 12, the fifth control unit 102 further includes a fourteenth transistor M14 and a sixteenth transistor M16. A source of the fourteenth transistor M14 is connected to the fifth node N5, a drain of the fourteenth transistor M14 is connected to the gate of the twelfth transistor M12, and a gate of the fourteenth transistor M14 is connected to the second voltage signal VGL1. A source of the sixteenth transistor M16 is connected to the sixth node N6, a drain of the sixteenth transistor M16 is connected to the first node N1, and a gate of the sixteenth transistor M16 is connected to the second voltage signal VGL1.

Based on any one of the preceding embodiments, in some embodiments of the present disclosure, as shown in FIGS. 6, 8, 10, and 12, the sixth control unit 103 further includes a seventeenth transistor M17 and an eighteenth transistor M18. A source of the seventeenth transistor M17 is connected to the first voltage signal VGH1, a drain of the seventeenth transistor M17 is connected to the third node N3, and a gate of the thirteenth transistor M17 is connected to the second node N2. A source of the eighteenth transistor M18 is connected to the second voltage signal VGL1, a drain of the eighteenth transistor M18 is connected to the third node N3, and a gate of the eighteenth transistor M18 is connected to the first node N1.

Based on any one of the preceding embodiments, in some embodiments of the present disclosure, as shown in FIGS. 6, 8, 10, and 12, the sixth control unit 103 further includes a third capacitor C3 and a fourth capacitor C4. A first electrode plate of the third capacitor C3 is connected to the first voltage signal VGH1, and a second electrode plate of the third capacitor C3 is connected to the second node N2. A first electrode plate of the fourth capacitor C4 is connected to the second clock signal XCK or the second voltage signal VGL1, and a second electrode plate of the fourth capacitor C4 is connected to the first node N1.

The operating process of the shift register shown in FIGS. 6, 8, 10, and 12 will be described below in conjunction with the timing sequence diagram of each signal in the shift register.

Figure 16:
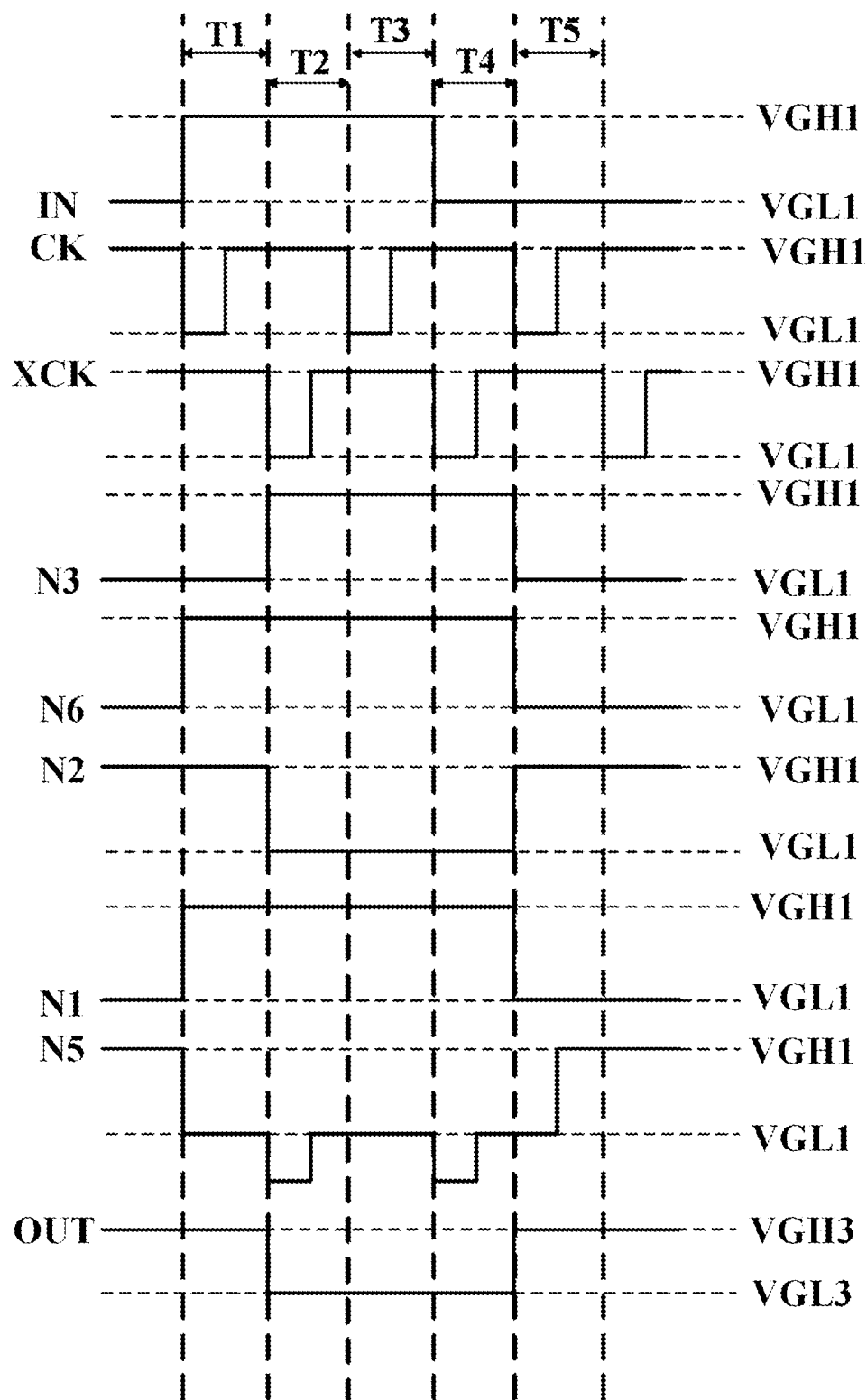
FIG. 16 is a timing sequence diagram of signals of nodes of another shift register according to an embodiment of the present disclosure.

FIG. 16 is a timing sequence diagram of signals of nodes of another shift register according to an embodiment of the present disclosure. Please refer to FIGS. 6, 8, 10, and 12.

In a T1 stage, the input signal IN is at a high level, the first clock signal CK is at a low level, the seventh transistor M7 is turned on, and the input signal IN is transmitted to the sixth node N6, so that the sixth node N6 is at a high level, the eleven transistor M11 is turned on, and the second voltage signal VGL1 is transmitted to the fifth node N5; the fifth node N5 is at a low level, the twelfth transistor M12 is turned on, the second clock signal XCK is at a high level, the seventh node N7 is maintained at a high level, the eighth transistor M8 is turned off, the thirteenth transistor M13 is turned off, the fifteenth transistor M15 is turned off, the second node N2 is maintained at a high level, the sixth transistor M6 is turned off, the seventeenth transistor M17 is turned off, the first node N1 is maintained at a high level, the eighteenth transistor M18 is turned off, the third node N3 is maintained at a low level, the fifth transistor M5 is turned on, and the fifth voltage signal VGH3 is transmitted to the output terminal; and the output signal OUT is at a high level.

In a T2 stage, the input signal IN is at a high level, the first clock signal CK is at a high level, the seventh transistor M7 is turned off, the eleventh transistor M11 is turned off, the sixth node N6 is maintained at a high level, the second clock signal XCK is at a low level, the eighth transistor M8 is turned on, the tenth transistor M10 is turned off, the fifth node N5 is maintained at a low level, the twelfth transistor M12 is turned on, and the second clock signal XCK is transmitted to the seventh node N7, so that the seventh node N7 is at a low level, the thirteenth transistor M13 is turned on, and a signal of the seventh node N7 is transmitted to the second node N2; the second node N2 is at a low level, the seventeenth transistor M17 is turned on, and the first voltage signal VGH1 is transmitted to the third node N3; the third node N3 is at a high level, the fifth transistor M5 is turned off, the sixth transistor M6 is turned on, and the sixth voltage signal VGL3 is transmitted to the output terminal; and the output signal OUT is at a low level.

In a T3 stage, the input signal IN is at a high level, the first clock signal CK is at a low level, the seventh transistor M7 is turned on, and the input signal IN is transmitted to the sixth node N6, so that the sixth node N6 is at a high level, the eleven transistor M11 is turned on, and the second voltage signal VGL1 is transmitted to the fifth node N5; the fifth node N5 is at a low level, the twelfth transistor M12 is turned on, the second clock signal XCK is at a high level, the seventh node N7 is maintained at a high level, the eighth transistor M8 is turned off, the thirteenth transistor M13 is turned off, the fifteenth transistor M15 is turned off, the seventeenth transistor M17 is turned off, the first node N1 is maintained at a high level, the eighteenth transistor M18 is turned off, the third node N3 is maintained at a high level, the fifth transistor M5 is turned off, the second node N2 is maintained at a low level, the sixth transistor M6 is turned on, and the sixth voltage signal VGL3 is transmitted to the output terminal; and the output signal OUT is at a low level.

In a T4 stage, the input signal IN is at a low level, the first clock signal CK is at a high level, the seventh transistor M7 is turned off, the eleventh transistor M11 is turned off, the sixth node N6 is maintained at a high level, the second clock signal XCK is at a low level, the eighth transistor M8 is turned on, the tenth transistor M10 is turned off, the fifth node N5 is maintained at a low level, the twelfth transistor M12 is turned on, and the second clock signal XCK is transmitted to the seventh node N7, so that the seventh node N7 is at a low level, the thirteenth transistor M13 is turned on, and the signal of the seventh node N7 is transmitted to the second node N2; the second node N2 is at a low level, the seventeenth transistor M17 is turned on, and the first voltage signal VGH1 is transmitted to the third node N3; the third node N3 is at a high level, the fifth transistor M5 is turned off, the sixth transistor M6 is turned on, and the sixth voltage signal VGL3 is transmitted to the output terminal; and the output signal OUT is at a low level.

In a T5 stage, the input signal IN is at a low level, the first clock signal CK is at a low level, the seventh transistor M7 is turned on, and the input signal IN is transmitted to the sixth node N6, so that the sixth node N6 is at a low level, the eleventh transistor M11 is turned on, and the second voltage signal VGL1 is transmitted to the fifth node N5; the fifth node N5 is at a low level, the twelfth transistor M12 is turned on, the second clock signal XCK is at a high level, the seventh node N7 is maintained at a high level, the eighth transistor M8 is turned off, the thirteenth transistor M13 is turned off, the sixth node N6 controls the fifteenth transistor M15 to be turned on, and the first voltage signal VGH1 is transmitted to the second node N2; the second node N2 is at a high level, the seventeenth transistor M17 is turned off, the sixth transistor M6 is turned off, the sixteenth transistor M16 is turned on, the signal of the sixth node N6 is transmitted to the first node N1, the first node N1 is at a low level, the first node N1 controls the eighteenth transistor M18 to be turned on, and the second voltage signal VGL1 is transmitted to the third node N3; the third node N3 is at a low level, the fifth transistor M5 is turned on, and the fifth voltage signal VGH3 is transmitted to the output terminal; and the output signal OUT is at a high level.

It is to be noted that the operating process of the preceding shift register only shows the potential of the output signal OUT in the case where the output signal OUT is controlled by the signal of the third node N3 and the signal of the second node N2 controlled by the first control part 10 (that is, the first transistor M1 and the third transistor M3 are turned on, and the second transistor M2 and the fourth transistor M4 are turned off). When the frequency control signal CRL controls the first transistor M1 and the third transistor M3 to be turned off and controls the second transistor M2 and the fourth transistor M4 to be turned on, the output signal OUT is controlled by the third voltage signal VG11 and the fourth voltage signal VG22, which will not be repeated here.

With continued reference to FIGS. 5 to 12, in an embodiment, to ensure the stability of the potentials of the second node N2 and the third node N3 and the stability of the output signal OUT, the second control part 20 further includes a first capacitor C1 and a second capacitor C2. A first electrode plate of the first capacitor C1 is connected to the fifth voltage signal VGH3, and a second electrode plate of the first capacitor C1 is connected to the third node N3. A first electrode plate of the second capacitor C2 is connected to the sixth voltage signal VGL3, and a second electrode plate of the second capacitor C2 is connected to the second node N2. The capacitance of the first capacitor C1 and the capacitance of the second capacitor C2 need to be large enough, so that it is ensured that the potential of the second node N2 and the potential of the fourth node N4 do not easily fluctuate, which may be set according to actual requirements.

With continued reference to FIG. 2, in an embodiment, in N stages of shift registers 200 of the driving circuit 100, the signal of the third node N3 of the shift register 200 at the M-th stage is connected to an input signal terminal of the shift register 200 at the (M+1)-th stage and is used as an input signal of the shift register 200 at the (M+1)-th stage, where 1≤M≤N.

As shown in FIG. 2, the driving circuit 100 includes N stages of shift registers 200, that is, includes N cascaded shift registers ASG1 to ASGN. In some embodiments of the present disclosure, the signal of the third node N3 of the shift register 200 at the M-th stage is connected to the input signal terminal of the shift register 200 at the (M+1)-th stage and is used as the input signal IN of the shift register 200 at the (M+1)-th stage, where 1<M N. That is, the signal Next of the third node N3 of the shift register 200 at the previous stage is used as the input signal IN of the shift register 200 at the next stage, and the output signal OUT of the shift register 200 at each stage as a drive signal is input to the pixel circuit 400.

In some embodiments of the present disclosure, as shown in FIG. 2, the display panel further includes a first/third voltage signal line XVGH1/XVG11, a second/fourth voltage signal line XVGL1/XVG22, a fifth voltage signal line XVGH3, a sixth voltage signal line XVGL3, a first frequency control signal line X1CRL, and a second frequency control signal line X2CRL.

The first/third voltage signal line XVGH1/XVG11 provides the first voltage signal VGH1 and the third voltage signal VG11 for the driving circuit 100.

The second/fourth voltage signal line XVGL1/XVG22 provides the second voltage signal VGL1 and the fourth voltage signal VG22 for the driving circuit 100.

The fifth voltage signal line XVGH3 provides the fifth voltage signal VGH3 for the driving circuit 100.

The sixth voltage signal line XVGL3 provides the sixth voltage signal VGL3 for the driving circuit 100.

The first frequency control signal line X1CRL provides the first frequency control signal 1CRL for the driving circuit 100.

The second frequency control signal line X2CRL provides the second frequency control signal 2CRL for the driving circuit 100.

In this embodiment, the case where the first voltage signal VGH1 is the same as the third voltage signal VG11, and the second voltage signal VGL1 is the same as the fourth voltage signal VG22 is used as an example. The first voltage signal VGH1 and the third voltage signal VG11 are provided by the same signal line, that is, the first/third voltage signal line XVGH1/XVG11, and the second voltage signal VGL1 and the fourth voltage signal VG22 are provided by the same signal line, that is, the second/fourth voltage signal line XVGL1/XVG22. In other embodiments, the signal lines that provide the first voltage signal VGH1 and the third voltage signal VG11 may be disposed separately, and the signal lines that provide the second voltage signal VGL1 and the fourth voltage signal VG22 may be disposed separately, which is not limited in embodiments of the present disclosure.

The fifth voltage signal VGH3 and the sixth voltage signal VGL3 are configured to generate output signals OUT, and the output signals are configured to provide drive signals for the pixel circuits 400 of the display region AA of the display panel. Therefore, to save the space of the driving circuit 100 as much as possible and to avoid excessively long wiring, the fifth voltage signal line XVGH3 and the sixth voltage signal line XVGL3 may be disposed on one side closer to the display region AA.

Based on this, in some embodiments of the present disclosure, at least one of the fifth voltage signal line XVGH3 or the sixth voltage signal line XVGL3 is located on one side of at least one of the first/third voltage signal line XVGH1/XVG11 or the second/fourth voltage signal line XVGL1/XVG22 facing toward the display region AA of the display panel.

In some embodiments of the present disclosure, as shown in FIG. 2, the first/third voltage signal line XVGH1/XVG11, the second/fourth voltage signal line XVGL1/XVG22, the fifth voltage signal line XVGH3, and the sixth voltage signal line XVGL3 are all located on one side of the driving circuit 100 facing away from the display region AA of the display panel. In addition, the fifth voltage signal line XVGH3 and the sixth voltage signal line XVGL3 are both located on one side of the first/third voltage signal line XVGH1/XVG11 and the second/fourth voltage signal line XVGL1/XVG22 closer to the display region AA or facing toward the display region AA of the display panel, so that the space saving of the driving circuit 100 can be maximized, and the wiring length can be reduced.

Figure 17:
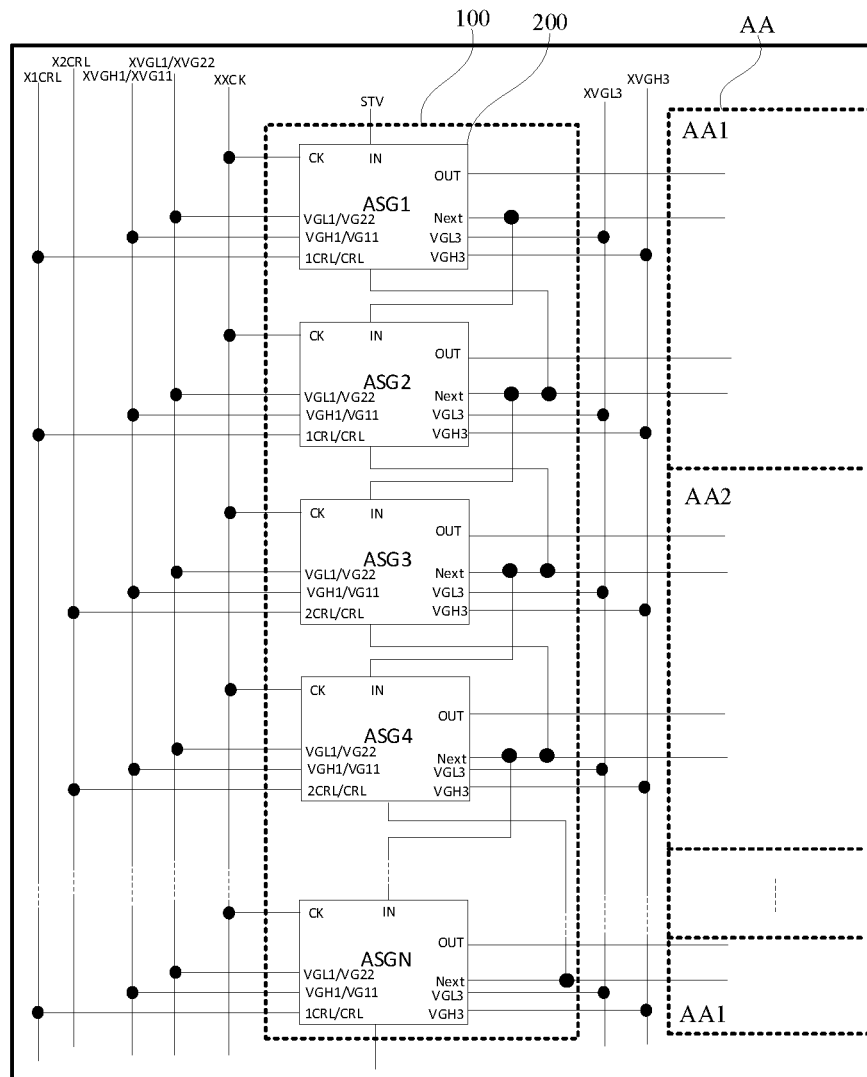
FIG. 17 is a structure diagram of another driving circuit according to an embodiment of the present disclosure.

Of course, the present disclosure is not limited to this. In other embodiments, as shown in FIG. 17, FIG. 17 is a structure diagram of another driving circuit according to an embodiment of the present disclosure. The first/third voltage signal line XVGH1/XVG11 and the second/fourth voltage signal line XVGL1/XVG22 are located on one side of the driving circuit 100 facing away from the display region AA of the display panel; the fifth voltage signal line XVGH3 and the sixth voltage signal line XVGL3 are located on one side of the driving circuit 100 facing toward the display region AA of the display panel, so that the space of the driving circuit 100 can be further saved, and the wiring length can be reduced.

Figure 18:
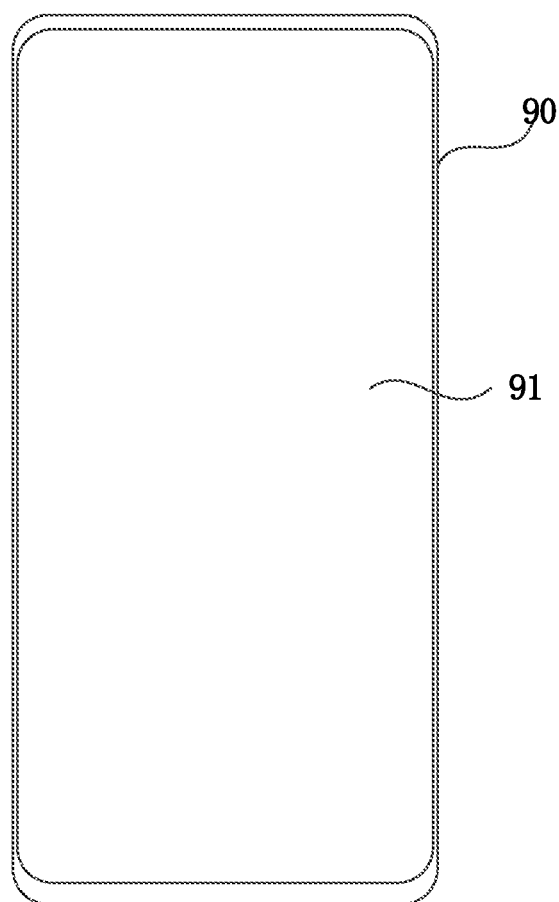
FIG. 18 is a structure diagram of a display device according to an embodiment of the present disclosure.

Based on the same inventive concept, an embodiment of the present disclosure further provides a display device. FIG. 18 is a structure diagram of a display device according to an embodiment of the present disclosure. As shown in FIG. 18, a display device 90 includes the display panel 91 according to any embodiment of the present disclosure. Therefore, the display device 90 provided in the embodiment of the present disclosure has any one of the embodiments described above, and structures which are the same as or correspond to the structures in the embodiments described above and the explanation of the terms will not be repeated here. The display device 90 provided in the embodiment of the present disclosure may be the phone shown in FIG. 18 or may be any electronic product with a display function, including but not limited to the following categories: televisions, laptops, desktop displays, tablet computers, digital cameras, smart bracelets, smart glasses, in-vehicle displays, medical displays, industrial control equipment, touch interactive terminals, which will not be specifically limited in embodiments of the present disclosure.

What is claimed is:

1. A display panel, comprising:
   a driving circuit comprising N stages of cascaded shift registers, wherein N≥ 2, and the shift register is configured to comprises: a first control part and a second control part,
   at least receive a frequency control signal to generate an output signal,
   wherein a display region of the display panel comprises a first region and a second region, and the frequency control signal comprises a first frequency control signal and a second frequency control signal; one shift register of the N stages of cascaded shift registers connected to a display unit in the first region is configured to receive the first frequency control signal; and one shift register of the N stages of cascaded shift registers connected to a display unit in the second region is configured to receive the second frequency control signal, and
   wherein a data refresh frequency of the display unit in the first region is a first frequency F1, and a data refresh frequency of the display unit in the second region is a second frequency F2, wherein F1<F2;
   the first frequency control signal and the second frequency control signal are signals of different potentials during at least part of a preset time period during which the display panel is operating; and a time length of the preset time period is T0, wherein T0>1/F2, or T0<1/F1.

2. The display panel of claim 1, wherein the shift register comprises: a first control part and a second control part;
   wherein the first control part is configured to control a signal of a second node and a signal of a third node; and the second control part is configured to at least receive the signal of the second node, the signal of the third node, and the frequency control signal to generate the output signal.

3. The display panel of claim 1, wherein the display unit comprises a pixel circuit and a light-emitting element;
   the pixel circuit comprises a data write module, a drive module, and a compensation module; the drive module comprises a drive transistor; the data write module is connected to a source of the drive transistor and is configured to selectively provide a data signal for the drive module; and the compensation module is connected between a gate of the drive transistor and a drain of the drive transistor; and
   the driving circuit is configured to provide a scanning signal for a control terminal of the compensation module.

4. The display panel of claim 3, wherein the driving circuit is configured to provide a first scanning signal for a control terminal of the compensation module of the display unit in the first region, and the driving circuit is configured to provide a second scanning signal for a control terminal of the compensation module of the display unit in the second region; and
   during at least part of the preset time period, the first scanning signal is configured to control the compensation module of the display unit in the first region to be kept off, and during at least part of the preset time period, the second scanning signal is configured to control the compensation module of the display unit in the second region to be turned on.

5. The display panel of claim 4, wherein the compensation module comprises a compensation transistor,
   wherein a gate of the compensation transistor in the compensation module of the display unit in the first region is configured to receive the first scanning signal, and a gate of the compensation transistor in the compensation module of the display unit in the second region is configured to receive the second scanning signal, and
   wherein the compensation transistor is an N-type transistor, the first scanning signal is maintained as a low level signal during at least part of the preset time period, and the second scanning signal is a high level signal during at least part of the preset time period; or
   the compensation transistor is a P-type transistor, the first scanning signal is maintained as a high level signal during at least part of the preset time period, and the second scanning signal is a low level signal during at least part of the preset time period.

6. The display panel of claim 1, wherein the display unit comprises a pixel circuit and a light-emitting element;
   the pixel circuit further comprises a drive module and a reset module; the drive module comprises a drive transistor; the reset module is connected to the gate of the drive transistor and is configured to provide a reset signal for the gate of the drive transistor; and
   the driving circuit is configured to provide a scanning signal for a control terminal of the reset module.

7. The display panel of claim 6, wherein the driving circuit is configured to provide a third scanning signal for a control terminal of the reset module of the display unit in the first region, and the driving circuit is configured to provide a fourth scanning signal for a control terminal of the reset module of the display unit in the second region; and during at least part of the preset time period, the third scanning signal is configured to control the reset module of the display unit in the first region to be kept off, and during at least part of the preset time period, the fourth scanning signal is configured to control the reset module of the display unit in the second region to be turned on.

8. The display panel of claim 7, wherein the reset module comprises a reset transistor;
   a gate of the reset transistor in the reset module of the display unit in the first region is configured to receive the third scanning signal, and a gate of the reset transistor in the reset module of the display unit in the second region is configured to receive the fourth scanning signal; and
   the reset transistor is an N-type transistor, the third scanning signal is maintained as a low level signal during at least part of the preset time period, and the fourth scanning signal is a high level signal during at least part of the preset time period; or
   the reset transistor is a P-type transistor, the third scanning signal is maintained as a high level signal during at least part of the preset time period, and the fourth scanning signal is a low level signal during at least part of the preset time period.

9. The display panel of claim 2, wherein the first control part is configured to receive a first voltage signal and a second voltage signal,
   wherein the second control part comprises a first control unit, a second control unit, and a third control unit; the first control unit is configured to receive a third voltage signal, a signal of the third node and the frequency control signal to control a signal of a fourth node; the second control unit is configured to receive a fourth voltage signal, a signal of the second node and the frequency control signal to control a signal of a fifth node,
   wherein the third control unit is configured to receive a fifth voltage signal and a signal of the fourth node to generate an output signal; or the third control unit is configured to receive a sixth voltage signal and a signal of the fifth node to generate an output signal, and
   wherein the first voltage signal is a high level signal, and the second voltage signal is a low level signal; one of the third voltage signal or the fourth voltage signal is a high level signal, and the other one of the third voltage signal or the fourth voltage signal is a low level signal; and the fifth voltage signal is a high level signal, and the sixth voltage signal is a low level signal.

10. The display panel of claim 9, wherein a potential of the first voltage signal is equal to or higher than a potential of the fifth voltage signal; and/or a potential of the second voltage signal is equal to or lower than a potential of the sixth voltage signal.

11. The display panel of claim 9, wherein a potential of one of the third voltage signal or the fourth voltage signal which is a high level signal is equal to a potential of the first voltage signal or equal to a potential of the fifth voltage signal; and/or
   a potential of one of the third voltage signal or the fourth voltage signal which is a low level signal is equal to a potential of the second voltage signal or equal to a potential of the sixth voltage signal.

12. The display panel of claim 11, wherein the first control unit comprises a first transistor and a second transistor;
   one terminal of the first transistor is connected to the third node, another terminal of the first transistor is connected to the fourth node, and a control terminal of the first transistor is configured to receive the frequency control signal; and
   one terminal of the second transistor is configured to receive the third voltage signal, another terminal of the second transistor is connected to the fourth node, and a control terminal of the second transistor is configured to receive the frequency control signal.

13. The display panel of claim 12, wherein in a case where the first transistor is turned on, the second transistor is turned off; or in a case where the first transistor is turned off, the second transistor is turned on.

14. The display panel of claim 9, wherein the second control unit comprises a third transistor and a fourth transistor;
   one terminal of the third transistor is connected to the second node, another terminal of the third transistor is connected to the fifth node, and a control terminal of the third transistor is configured to receive the frequency control signal; and
   one terminal of the fourth transistor is configured to receive the fourth voltage signal, another terminal of the fourth transistor is connected to the fifth node, and a control terminal of the fourth transistor is connected to receive the frequency control signal.

15. The display panel of claim 14, wherein in a case where the third transistor is turned on, the fourth transistor is turned off; or in a case where the third transistor is turned off, the fourth transistor is turned on.

16. The display panel of claim 14, wherein the control terminal of the first transistor, the control terminal of the second transistor, the control terminal of the third transistor, and the control terminal of the fourth transistor are configured to receive a same frequency control signal.

17. The display panel of claim 14, wherein the frequency control signal comprises a first sub-control signal and a second sub-control signal, wherein each of the control terminal of the first transistor and the control terminal of the third transistor is configured to receive the first sub-control signal, and each of the control terminal of the second transistor and the control terminal of the fourth transistor is configured to receive the second sub-control signal; and
   an active pulse time of the first sub-control signal and an active pulse time of the second sub-control signal do not overlap.

18. The display panel of claim 14, wherein the third control unit comprises a fifth transistor and a sixth transistor;
   one terminal of the fifth transistor is configured to receive the fifth voltage signal, another terminal of the fifth transistor is connected to an output signal terminal, and a control terminal of the fifth transistor is connected to the fourth node;
   one terminal of the sixth transistor is configured to receive the sixth voltage signal, another terminal of the sixth transistor is connected to the output signal terminal, and a control terminal of the sixth transistor is connected to the fifth node.

19. The display panel of claim 2, wherein in the N stages of shift registers of the driving circuit, a signal of the third node of the shift register at the M-th stage is transmitted to an input signal terminal of a shift register at the (M+1)-th stage, and is used as an input signal of the shift register at the (M+1)-th stage, where $1 \leq M \leq N$.

20. A display device, comprising a display panel, wherein the display panel comprises:

a driving circuit comprising N stages of cascaded shift registers, wherein N≥ 2, and the shift register is configured to
at least receive a frequency control signal to generate an output signal,
wherein a display region of the display panel comprises a first region and a second region, and the frequency control signal comprises a first frequency control signal and a second frequency control signal; one shift register of the N stages of cascaded shift registers connected to a display unit in the first region is configured to receive the first frequency control signal; and one shift register of the N stages of cascaded shift registers connected to a display unit in the second region is configured to receive the second frequency control signal, and
wherein a data refresh frequency of the display unit in the first region is a first frequency F1, and a data refresh frequency of the display unit in the second region is a second frequency F2, wherein F1<F2;
the first frequency control signal and the second frequency control signal are signals of different potentials during at least part of a preset time period during which the display panel is operating; and a time length of the preset time period is T0, wherein T0>1/F2, or T0<1/F1.

* * * * *